United States Patent
Luo

(10) Patent No.: US 11,605,797 B2
(45) Date of Patent: Mar. 14, 2023

(54) DISPLAY PANEL AND METHOD FOR MANUFACTURING THE SAME, AND DISPLAY DEVICE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 212 days.

(21) Appl. No.: 16/973,340

(22) PCT Filed: Mar. 20, 2020

(86) PCT No.: PCT/CN2020/080385
§ 371 (c)(1),
(2) Date: Dec. 8, 2020

(87) PCT Pub. No.: WO2020/192577
PCT Pub. Date: Oct. 1, 2020

(65) Prior Publication Data
US 2021/0249626 A1    Aug. 12, 2021

(30) Foreign Application Priority Data
Mar. 28, 2019    (CN) .......................... 201910242247.7

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3246* (2013.01); *H01L 51/56* (2013.01)

(58) Field of Classification Search
None
See application file for complete search history.

(56) References Cited

U.S. PATENT DOCUMENTS 8,824,155 B2 * 9/2014 Hwang .................... H05K 5/02
361/756
2007/0080471 A1 * 4/2007 Yazawa ................... H01L 23/40
257/E23.083

(Continued)

FOREIGN PATENT DOCUMENTS

CN    201182049 Y    1/2009
CN    106784351 A    5/2017

(Continued)

OTHER PUBLICATIONS

PCT International Search Report (w/ English translation) for corresponding PCT Application No. PCT/CN2020/080385, dated Jun. 5, 2020, 5 pages.

(Continued)

*Primary Examiner* — Michelle Mandala
(74) *Attorney, Agent, or Firm* — Dority & Manning, P.A.

(57) ABSTRACT

A display panel has a display area and a frame area located at at least one side of the display area. The display panel includes a base, at least one groove, a plurality of light-emitting devices, at least one first fixing component, and a sealant disposed at least in the frame area. At least one groove is arranged at a side of the base, and the at least one groove is located in the frame area. Each first fixing component includes a first portion and a second portion, and the first portion of the first fixing component is embedded in a groove. The sealant is located at the side of the base having the at least one groove, and the second portion of the first fixing component is embedded in the sealant.

20 Claims, 11 Drawing Sheets

(56) References Cited

U.S. PATENT DOCUMENTS

| | | | |
|---|---|---|---|
| 2011/0298112 A1 | 12/2011 | Mori | |
| 2012/0113607 A1 | 5/2012 | Hwang | |
| 2014/0001619 A1 | 1/2014 | Yoo et al. | |
| 2015/0179721 A1 | 6/2015 | Lee | |
| 2017/0301739 A1 | 10/2017 | Park et al. | |
| 2018/0159070 A1* | 6/2018 | He | H01L 27/3244 |
| 2018/0331320 A1* | 11/2018 | Su | H01L 27/3246 |
| 2019/0051857 A1* | 2/2019 | Xu | H01L 51/5221 |
| 2020/0251680 A1 | 8/2020 | Wang et al. | |
| 2021/0091337 A1* | 3/2021 | Zhao | H01L 51/5253 |
| 2022/0199727 A1* | 6/2022 | Lee | H01L 27/3223 |

FOREIGN PATENT DOCUMENTS

| | | | |
|---|---|---|---|
| CN | 106876428 A | 6/2017 | |
| CN | 109830616 A | 5/2019 | |

OTHER PUBLICATIONS

Chinese First Office Action (w/ English translation) for corresponding CN Application No. 201910242247.7, 16 pages.
Chinese Second Office Action (w/ English translation) for corresponding CN Application No. 201910242247.7, 16 pages.

* cited by examiner

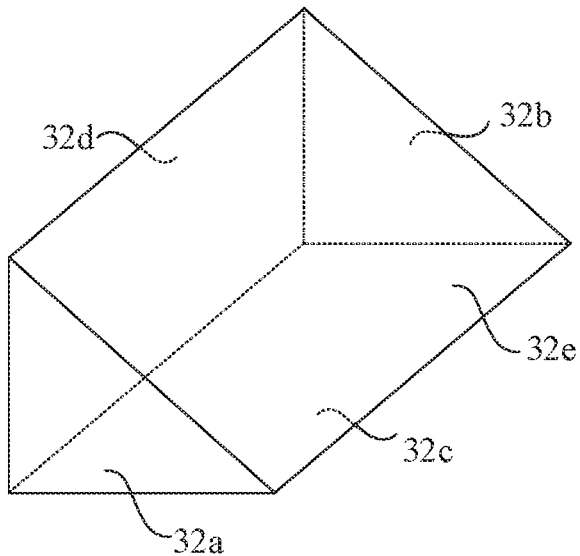

FIG. 13

| A base is provided. The base has a display area and a frame area located at at least one side of the display area. | S100 |

↓

| At least one groove is formed at a side of the base. The at least one groove is located in the frame area. | S200 |

↓

| At least one first fixing component is formed at the side of the base where the at least one groove has been formed. Each first fixing component includes a first portion and a second portion, and the first portion of the first fixing component is embedded in a groove. | S300 |

↓

| A plurality of light-emitting devices are formed at a side of the base where the at least one groove has been formed. The plurality of light-emitting devices are located in the display area. | S400 |

↓

| A sealant is formed. The sealant is located at the side of the base where the at least one groove has been formed. The sealant is located at least in the frame area, and the second portion of the first fixing component is embedded in the sealant. | S500 |

FIG. 14

A photoresist pattern is formed on a side of the base, and the base is etched by using the photoresist pattern as a mask to form at least one first accommodating portion. Each first accommodating portion includes a bottom wall and a side wall connected to the bottom wall, and the side wall includes a first region and a second region. ~ S210

A corrosion-resistant film is formed in the first region of the side wall and on the bottom wall. The corrosion-resistant film exposes the second region of the side wall. The second region of the side wall is connected to the bottom wall, and there is a distance between the second region of the side wall and a main surface of the base proximate to the sealant. ~ S220

The second region of the side wall is etched by using the wet etching process to form the second accommodating portion. The second accommodating portion extends in a direction parallel to the main surface of the base proximate to the sealant, and one end of the second accommodating portion is connected to the first accommodating portion. ~ S230

FIG. 15

A pixel defining film is formed at a side of the base where the at least one groove has been formed. ~ S410

The pixel defining film is patterned to form a plurality of openings located in the display area and the at least one first fixing component located in the frame area. Each first fixing component includes the first portion embedded in the first accommodating portion, an extension portion located in the second accommodating portion, and the second portion protruding with respect to the main surface of the base. ~ S420

FIG. 16

DISPLAY PANEL AND METHOD FOR MANUFACTURING THE SAME, AND DISPLAY DEVICE

CROSS-REFERENCE TO RELATED APPLICATIONS

This application is a national phase entry under 35 USC 371 of International Patent Application No. PCT/CN2020/080385 filed on Mar. 20, 2020, which claims priority to Chinese Patent Application No. 201910242247.7, filed on Mar. 28, 2019, which are incorporated herein by reference in their entirety.

TECHNICAL FIELD

The present disclosure relates to the field of display technologies, and in particular, to a display panel and a method for manufacturing the same, and a display device.

BACKGROUND

Organic light-emitting diode (abbreviated as OLED) display panels, quantum dot light-emitting diode (abbreviated as QLED) display panels and the like have gradually received widespread attention and have been widely used in the display field due to their advantages of wide color gamut, being capable of achieving ultra-thin and flexible display, etc.

SUMMARY

In an aspect, a display panel is provided. The display panel has a display area and a frame area located at at least one side of the display area. The display panel includes a base, at least one groove, a plurality of light-emitting devices, at least one first fixing component, and a sealant disposed at least in the frame area. The at least one groove is arranged at a side of the base, and located in the frame area. The plurality of light-emitting devices are disposed at the side of the base having the at least one groove, and the plurality of light-emitting devices are located in the display area. Each first fixing component includes a first portion and a second portion, and the first portion of the first fixing component is embedded in a groove. The sealant being located at the side of the base having the at least one groove, and the second portion of the first fixing component is embedded in the sealant.

In some embodiments, the second portion of the first fixing component has a fixing through hole, and the fixing through hole penetrates opposite side faces of the second portion of the first fixing component. The fixing through hole is filled with the sealant. A part of the sealant fills the fixing through hole.

In some embodiments, the second portion of the first fixing component has a wedge shape, and a tip of the wedge is away from the base substrate.

In some embodiments, the second portion of the first fixing component has a shape of a right triangular prism. The second portion of the first fixing component includes a first side face and a second side face disposed opposite to each other, and the fixing through hole penetrates the first side face and the second side face. The second portion of the first fixing component further includes an inclined face located between the first side face and the second side face, an angle between the inclined face and a main surface of the base proximate to the sealant is an acute angle, and the inclined face is disposed to face the light-emitting devices.

In some embodiments, the groove includes a first accommodating portion and a second accommodating portion. The first accommodating portion extends from a main surface of the base proximate to the sealant to an inside of the base, and the first portion of the first fixing component is embedded in the first accommodating portion. The second accommodating portion is located inside the base, the second accommodating portion extends in a direction parallel to the main surface of the base proximate to the sealant, and one end of the second accommodating portion is connected to an end of the first accommodating portion extending to the inside of the base. The first fixing component further includes an extension portion, and the extension portion is located in the second accommodating portion and connected to the first portion of the first fixing component.

In some embodiments, the extension portion, the first portion of the first fixing component, and the second portion of the first fixing component are integrally formed.

In some embodiments, there is an infiltration through hole disposed between the main surface of the base proximate to the sealant and the second accommodating portion. The infiltration through hole exposes the extension portion.

In some embodiments, an orthographic projection of the infiltration through hole on the main surface of the base proximate to the sealant is within a range of an orthographic projection of the extension portion on the main surface of the base proximate to the sealant.

In some embodiments, the first fixing component further includes an infiltration portion disposed in the infiltration through hole, and the infiltration portion is connected to the extension portion.

In some embodiments, the infiltration through hole is located at a side of the first accommodating portion away from the display area.

In some embodiments, the display panel further includes a pixel defining layer disposed at the side of the base having the at least one groove, and the pixel defining layer has a plurality of openings. At least a part of a light-emitting layer of each light-emitting device is located in an opening. The first fixing component is made of a same material and disposed in a same layer as the pixel defining layer.

In some embodiments, the at least one first fixing component includes a plurality of first fixing components. The plurality of first fixing components are located at at least one side of the display area. Or, the plurality of first fixing components are located at at least one corner of the display area.

In some embodiments, the display panel further includes a second fixing component adjacent to the first fixing component, and the second fixing component is disposed at a side of the first fixing component proximate to the display area. The second fixing component and the first fixing component are mirror-symmetrical with respect to a plane that is located the second fixing component and the first fixing component and perpendicular to the base. A portion of the second fixing component that is mirror-symmetrical to the second portion of the first fixing component is embedded in the sealant.

In some embodiments, an orthographic projection of the first fixing component on a main surface of the base proximate to the sealant has an arched shape, a circular shape, a rectangular shape or an elliptic shape.

In another aspect, a method for manufacturing a display panel is provided. The method includes: providing a base, the base having a display area and a frame area located at at least one side of the display area; forming at least one groove at a side of the base, the at least one groove being located in the frame area; forming at least one first fixing component at the side of the base where the at least one groove has been formed, each first fixing component including a first portion and a second portion, and the first portion of the first fixing component being embedded in a groove; forming a plurality of light-emitting devices at the side of the base where the at least one groove has been formed, the plurality of light-emitting devices being located in the display area; and forming a sealant, the sealant being located at the side of the base where the at least one groove has been formed, the sealant being located at least in the frame area, and the second portion of the first fixing component being embedded in the sealant.

In some embodiments, the step of forming at least one groove at aside of the base includes: forming a photoresist pattern on a side of the base; etching the base by using the photoresist pattern as a mask to form at least one first accommodating portion, each first accommodating portion including a bottom wall and a side wall connected to the bottom wall, and the side wall including a first region and a second region; forming a corrosion-resistant film in the first region of the side wall and on the bottom wall, the corrosion-resistant film exposing the second region of the side wall, and the second region of the side wall being connected to the bottom wall, and there being a distance between the second region of the side wall and a main surface of the base proximate to the sealant; and etching the second region of the side wall by using a wet etching process to form a second accommodating portion, the second accommodating portion extending in a direction parallel to the main surface of the base proximate to the sealant, and one end of the second accommodating portion being connected to the first accommodating portion.

In some embodiments, the step of forming a plurality of light-emitting devices includes: forming light-emitting layers of the plurality of light-emitting devices. Before the light-emitting layers of the plurality of light-emitting devices are formed, the method includes: forming a pixel defining film at the side of the base where the at least one groove has been formed; and patterning the pixel defining film to form a plurality of openings located in the display area and the at least one first fixing component located in the frame area. Each first fixing component includes the first portion embedded in the first accommodating portion, an extension portion located in the second accommodating portion, and the second portion protruding with respect to the main surface of the base.

In yet another aspect, a display device is provided. The display device includes the display panel according to some embodiments described above.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not intended to limit an actual size of a product and an actual process of a method involved in the embodiments of the present disclosure.

FIG. 13 is a diagram showing a structure of a second portion of a first fixing component, in accordance with some embodiments of the present disclosure;

FIG. 14 is a flow diagram of a method for manufacturing a display panel, in accordance with some embodiments of the present disclosure;

FIG. 15 is a flow diagram of a method for manufacturing a groove, in accordance with some embodiments of the present disclosure;

FIG. 16 is a flow diagram of a method for forming a pixel defining layer and first fixing component(s), in accordance with some embodiments of the present disclosure;

DETAILED DESCRIPTION

Technical solutions in some embodiments of the present disclosure will be described below clearly and completely in combination with accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description, the terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments/examples in any suitable manner.

Hereinafter, the terms such as "first" and "second" are used for descriptive purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified.

In the description of some embodiments, the term "connect" and its extensions may be used. For example, the term "connect" may be used in the description of some embodiments to indicate that two or more elements are in direct physical contact or electric contact with each other.

The phrase "A and/or B" includes the following three combinations: only A, only B, and a combination of A and B.

Generally, an organic light-emitting diode (OLED) display panel or a quantum dot light-emitting diode (QLED) display panel includes a plurality of light-emitting devices, and an encapsulation structure configured to protect the plurality of light-emitting devices.

Figure 1:
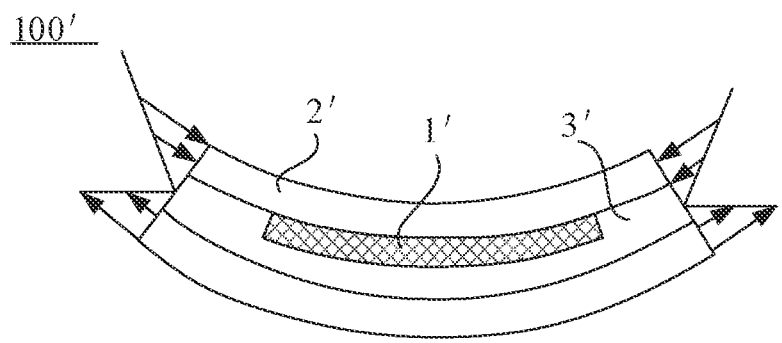
FIG. 1 is a diagram showing a structure of an OLED display panel when it is bent, in the related art.

As shown in FIG. 1, the OLED display panel 100' is taken as an example below. The OLED display panel 100' includes a plurality of OLED devices 1', and a light-emitting layer and a cathode layer in an OLED device are easy to react with moisture and/or oxygen, which causes the OLED device 1' to fail. As a result, the OLED device 1' needs to be encapsulated to prolong its service life.

In the related art, the OLED device 1' is encapsulated with a resin adhesive 3'. That is, the resin adhesive 3' is formed at least at a periphery of the OLED device 1', and is bonded to a base substrate 2' in the OLED display panel 100'. Such an encapsulation manner has a good encapsulation effect, and a forming process is simple. In addition, after the resin adhesive 3' is cured and molded, stress inside the resin adhesive 3' is small, which may effectively avoid cracks appearing in the resin adhesive 3'.

However, currently, the base substrate 2' in the OLED display panel 100' is usually made of glass, polyimide (abbreviated as PI), etc., and there is certain limitation on adhesion between the resin adhesive 3' and the glass or P. As shown in FIG. 1, in a subsequent process of cutting an OLED display motherboard to form the OLED display panel 100' and transporting or assembling the OLED display panel 100', the OLED display panel 100' is prone to bending, thereby causing the resin adhesive 3' to be peeled off from the base substrate 2', and further causing the moisture and/or oxygen to corrode the OLED device 1' and affecting the service life of the OLED device 1'.

Some embodiments of the present disclosure provide a display panel 100. As shown in FIGS. 2 to 5, the display panel 100 has a display area A and a frame area B located at at least one side of the display area A.

Herein, as shown in FIGS. 2 to 5, the frame area B is located at a periphery of the display area A and surrounds the display area A. Or, the frame area B is located at a part of the periphery of the display area A, and does not surround the display area A. For example, the frame area B is located at two opposite sides of the display area A. For another example, the frame area B is located at two adjacent sides of the display area A. For another example, the frame area B is located at one side of the display area A.

There are various types of the display panel 100. For example, the display panel 100 may be a flexible display panel. For another example, the display panel 100 may be a rigid display panel.

In some examples, as shown in FIGS. 6 to 11, the display panel 100 includes a base 1 with at least one groove C at a side of the base 1, and the at least one groove C is located in the frame area B.

A structure of the base 1 may be various. For example, the base 1 may be a blank substrate. For another example, the base 1 may include a blank substrate, and at least one functional film (e.g., an insulating layer or a buffer layer) disposed on a surface of the substrate.

With respect to the at least one groove C, a structure of each groove C is related to the structure of the base 1. For example, in a case where the base 1 is the blank substrate, each groove C extends from the surface of the substrate to an inside of the substrate; and in a case where the base 1 includes the blank substrate and the at least one functional film (e.g., the buffer layer), each groove C penetrates the at least one functional film and extends to the inside of the substrate.

In addition, a type of the base 1 is related to the type of the display panel 100. For example, in a case where the display panel 100 is the flexible display panel, a base substrate in the base 1 may include a flexible material, such as PI; and in a case where the display panel 100 is the rigid display panel, the base substrate in the base 1 may include a rigid material, such as glass or quartz.

In some examples, as shown in FIGS. 6 to 11, the display panel 100 further includes a plurality of light-emitting devices 2 disposed at a side of the base 1 with the at least one groove C. The plurality of light-emitting devices 2 are located in the display area A.

As shown in FIGS. 6 to 11, the light-emitting device 2 may include a first electrode 21, a light-emitting layer 22 and a second electrode 23 that are sequentially stacked in a direction perpendicular to the base 1. Herein, the first electrode 21 may be an anode, and the second electrode 23 may be a cathode; or, the first electrode 21 may be a cathode, and the second electrode 23 may be an anode.

A type of the light-emitting layer 22 is related to the display panel 100.

For example, the display panel 100 is an OLED display panel. In this case, the light-emitting device 2 is an OLED light-emitting device, and the light-emitting layer 22 includes an organic light-emitting layer. For example, the display panel 100 is a QLED display panel. In this case, the light-emitting device 2 is a QLED light-emitting device, and the light-emitting layer 22 includes a quantum dot light-emitting layer.

In some examples, the display panel 100 further includes: a driver circuit disposed at a side of each light-emitting device 2 proximate to the base 1. The driver circuit is configured to provide a driving voltage for the light-emitting device 2 to control a light-emitting state of the light-emitting device 2, so that the display panel 100 achieves a gray scale display.

The driver circuit may be composed of a plurality of thin film transistors and at least one storage capacitor. The plurality of thin film transistors include a driving transistor and at least one switching transistor. The driving transistor may be electrically connected to the first electrode 21 or the second electrode 23 of the light-emitting device 2. For example, the thin film transistor DT shown in FIGS. 6 to 11 is a driving transistor.

Herein, a structure of the driver circuit may be various. For example, the driver circuit may have a "6T1C" structure, a "7T1C" structure, a "6T2C" structure or a "7T2C" structure. 'T' represents a thin film transistor, and the number before "T" represents the number of thin film transistors. "C" represents a storage capacitor, and the number before "C" represents the number of storage capacitors.

In some examples, as shown in FIGS. 6 to 11, the display panel 100 further includes a sealant 4 disposed at least in the frame area B. The sealant 4 is bonded to a surface of the base 1.

Herein, the sealant 4 may only be disposed in the frame area B. In this case, the sealant 4 is in a shape of a closed loop and surrounds a periphery of the plurality of light-emitting devices 2. Or, on this basis, the sealant 4 may be disposed in the display area A. In this case, the sealant 4 not only surrounds the periphery of the plurality of light-emitting devices 2, but also covers surfaces of the plurality of light-emitting devices 2 away from the base 1.

A material of the sealant 4 may include various materials. The material of the sealant 4 is not limited in the present examples, as long as the sealant 4 may well encapsulate the plurality of light-emitting devices 2 and prevent moisture and/or oxygen from entering the plurality of light-emitting devices 2.

For example, the material of the sealant 4 includes epoxy resin. In addition, on this basis, the material of the sealant 4 may further include a homopolymer or a copolymer of monomers such as glycidyl acrylate, glycidyl methacrylate, methyl methacrylate, ethyl methacrylate, n-butyl methacrylate, 6,7-epoxyheptyl methacrylate or 2-hydroxyethyl methacrylate, and an additive material such as melamine formaldehyde resin, unsaturated polyester resin, organic silicone resin, or furan resin.

In some examples, as shown in FIGS. 6 to 11, the display panel 100 further includes a cover plate 5, and the cover plate 5 and the sealant 4 together form an encapsulation structure to encapsulate the plurality of light-emitting devices 2. The encapsulation structure completely covers the surfaces of the plurality of light-emitting devices 2 away from the base 1 and the periphery of the plurality of light-emitting devices 2, thereby forming a good encapsulation for the plurality of light-emitting devices 2.

The cover plate 5 may only be disposed on a side of the sealant 4 away from the base 1. That is, the cover plate 5 is in a shape of a plate and only covers the surfaces of the plurality of light-emitting devices 2 away from the base 1. In addition, on this basis, the cover plate 5 may further be in a shape of an open box, and surrounds the periphery of the plurality of light-emitting devices 2.

Herein, a type of the cover plate 5 is related to the type of the display panel 100. For example, in the case where the display panel 100 is the flexible display panel, the cover plate 5 may be a flexible cover plate, and a material thereof may be PI; and in the case where the display panel 100 is the rigid display panel, the cover plate 5 may be a rigid cover plate, and a material thereof may be glass or quartz.

There are various relative positional relationships between the cover plate 5 and the sealant 4.

For example, in a case where the cover plate 5 and the sealant 4 both cover the surfaces of the plurality of light-emitting devices 2 away from the base 1, the cover plate 5 may be disposed on a side of the sealant 4 proximate to the plurality of light-emitting devices 2, or may be disposed on a side of the sealant 4 away from the plurality of light-emitting devices 2.

For example, in a case where the cover plate 5 and the sealant 4 both surround the periphery of the plurality of light-emitting devices 2, the cover plate 5 may be disposed on a side of the sealant 4 proximate to the plurality of light-emitting devices 2, or may be disposed on a side of the sealant 4 away from the light-emitting devices 2.

In some examples, as shown in FIGS. 6 to 11, the display panel 100 further includes at least one first fixing component 3. That is, the display panel 100 may include one first fixing component 3 or a plurality of first fixing components 3. Each first fixing component 3 includes a first portion 31 and a second portion 32, and the first portion 31 is embedded in a groove C.

For example, the first portion 31 and the second portion 32 of each first fixing component 3 are connected, and they are integrally formed. This is advantageous for simplifying manufacturing processes of the display panel 100.

Herein, the first portion 31 of the first fixing component 3 being embedded in the groove C may be that the first portion 31 of each first fixing component 3 is embedded in a groove C, and only the first portion 31 of one first fixing component 3 is embedded in the groove C.

It will be noted that, the term "embedded" mentioned herein means that an embedding object is located inside an embedded object, and the two objects may be firmly fixed, and are difficult to be separated from each other. For example, the first portion 31 of the first fixing component 3 is embedded in the groove C. That is, the first portion 31 of the first fixing component 3 is located inside the groove C, and is firmly fixed in the groove C, and is difficult to be separated from the inside of the groove C.

In some examples, as shown in FIGS. 6 to 11, the second portion 32 of the first fixing component 3 is embedded in the sealant 4. Herein, the first portion 31 of the first fixing component 3 is embedded in the groove C located in the frame area B, and the first portion 31 and the second portion 32 of the first fixing component 3 are of an integrated structure. In this way, in a case where the sealant 4 is only disposed in the frame area B, or the sealant 4 is disposed in both the frame area B and the display area A, the second portion 32 of the first fixing component 3 is embedded in a portion of the sealant 4 in the frame area B.

The second portion 32 of the first fixing component 3 is embedded in the sealant 4. That is, the second portion 32 of the first fixing component 3 is located inside the sealant 4. For example, the second portion 32 of the first fixing component 3 may be firmly fixed in the sealant 4, and is difficult to be separate from the inside of the sealant 4.

For example, an orthographic projection of the first fixing component 3 on the base 1 is within a range of an orthographic projection of the sealant 4 on the base 1. In this way, the first fixing component 3 may be prevented from becoming a channel for the moisture and/or oxygen to enter the light-emitting device 2, and an encapsulation effect may be ensured.

In the display panel 100 provided by some embodiments of the present disclosure, by arranging groove(s) C at a side of the base 1 and arranging first fixing component(s) 3, the first portion(s) 31 of the first fixing component(s) 3 are embedded in the groove(s) C, and the second portion(s) 32 of the first fixing component(s) 3 are embedded in the sealant 4 bonded to the base 1, the first fixing component(s) 3 may play a connection role between the base 1 and the sealant 4. In a process of cutting a display motherboard including a plurality of display panels 100, or transporting or assembling the display panels 100, stress generated between the sealant 4 and the base 1 may be shared by using the first fixing component 3, that is, the connection between the sealant 4 and the base 1 may be strengthened by using the first fixing component 3 to prevent the sealant 4 from being peeled off from the base 1, thereby avoiding the moisture and/or oxygen from corroding the light-emitting device 2, and avoiding impact on the service life of the light-emitting device 2.

Figure 9:
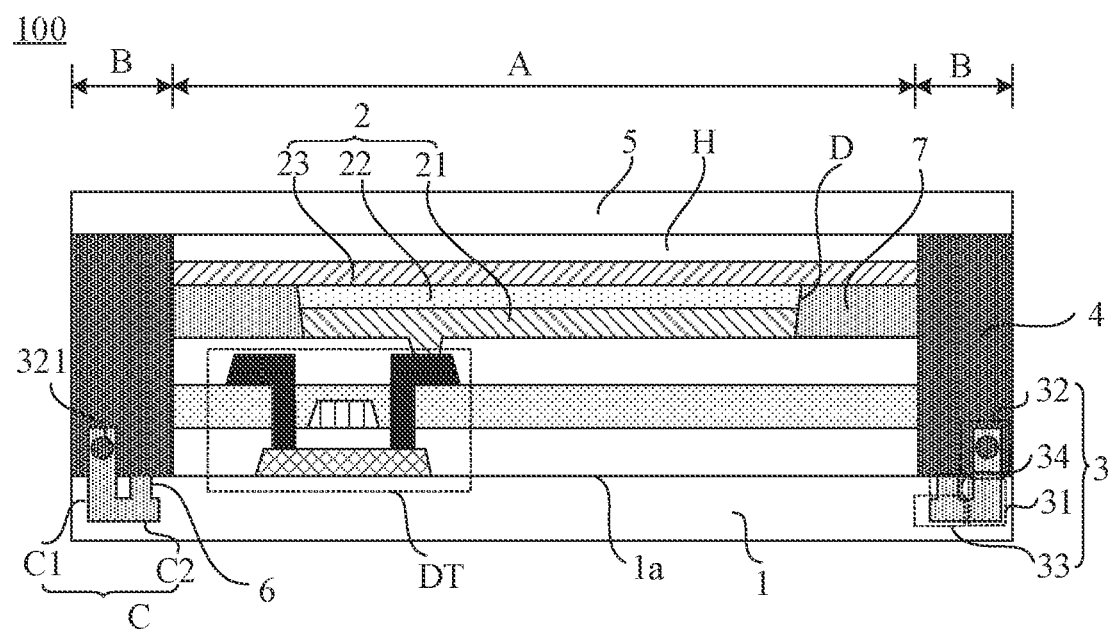
FIG. 9 is yet another sectional view of the display panel shown in FIG. 5 taken along the direction E-E'.
Figure 10:
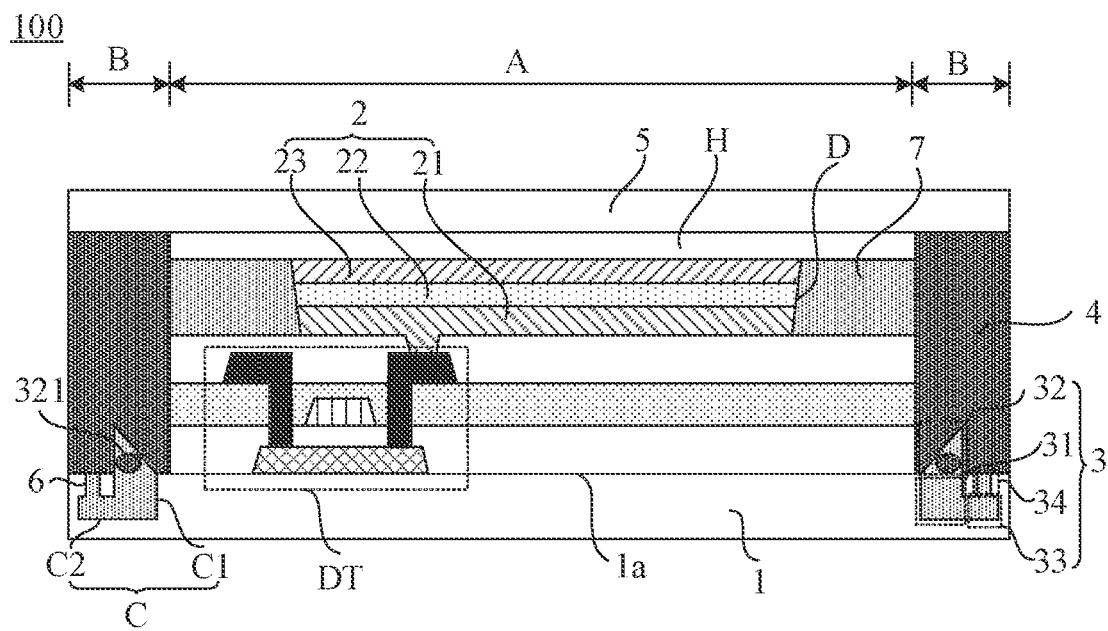
FIG. 10 is yet another sectional view of the display panel shown in FIG. 5 taken along the direction E-E'.
Figure 11:
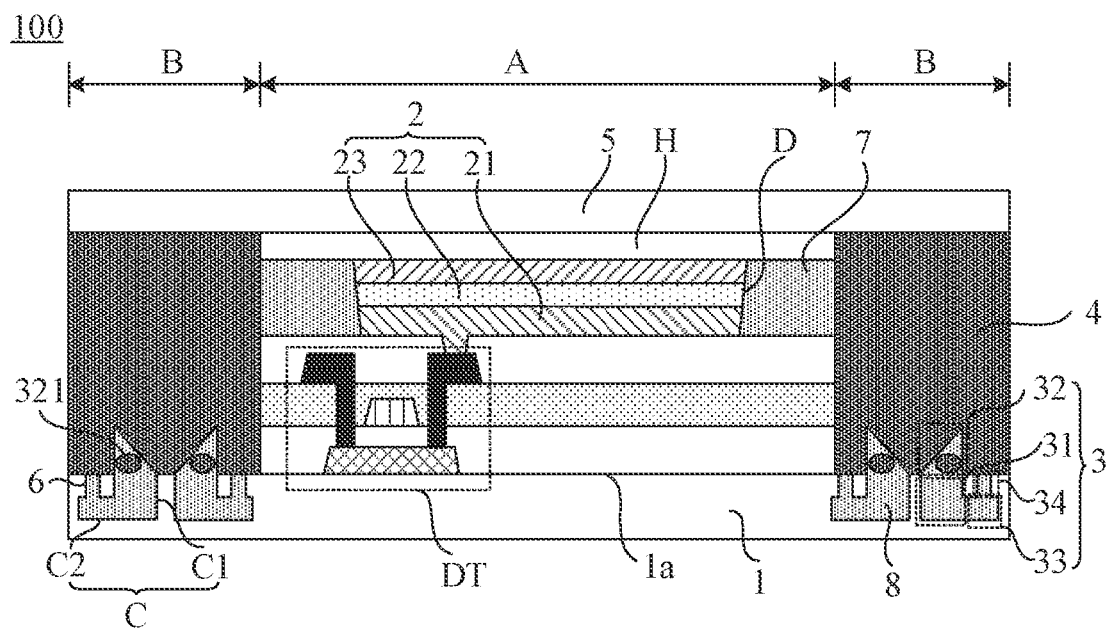
FIG. 11 is yet another sectional view of the display panel shown in FIG. 5 taken along the direction E-E'.

In some embodiments, as shown in FIGS. 9 to 11, the second portion 32 of the first fixing component 3 has a fixing through hole 321, and the fixing through hole 321 penetrates opposite side faces of the second portion 32 of the first fixing component 3.

A penetration direction of the fixing through hole 321 is not limited in the present embodiments, as long as the fixing through hole 321 penetrates the opposite side faces of the second portion 32 of the first fixing component 3. For example, if the second portion 32 of the first fixing component 3 is in a cuboid shape, the fixing through hole 321 penetrates any two opposite side faces of the cuboid in a direction parallel or substantially parallel to the base 1.

A forming manner and a size of the fixing through hole 321 are related to a material of the first fixing component 3.

For example, the material of the first fixing component 3 is a photosensitive adhesive. In this case, the second portion 32 of the first fixing component 3 may be irradiated with a laser beam, and the laser beam can pass through the second portion 32 of the first fixing component 3 to form the fixing through hole 321. An inner diameter of the fixing through hole 321 may account for one third to one half of a height of the second portion 32 of the first fixing component 3 (i.e., a dimension of the second portion 32 of the first fixing component 3 in a direction perpendicular to the base 1).

For example, considering the process of forming the fixing through hole 321 by using the laser beam, since a size of a spot formed by the laser beam is usually greater than or equal to 5 μm, the height of the second portion 32 of the first fixing component 3 may be greater than 7 μm, so as to ensure that the fixing through hole 321 can be formed in the second portion 32 of the first fixing component 3.

In some examples, as shown in FIGS. 9 to 11, the fixing through hole 321 is filled with a part of the sealant 4.

There are various types of the sealant 4. For example, the sealant 4 may be a sheet adhesive or a liquid adhesive.

In a case where the frame sealant 4 is the liquid adhesive, the sealant 4 may be formed on a surface of the cover plate 5 by means of dispensing or coating. Then, the cover plate 5 on which the sealant 4 is formed and the base 1 above which the light-emitting devices 2 are formed are assembled to achieve the encapsulation of the light-emitting devices 2.

In a case where the sealant 4 is the sheet adhesive, the sealant 4 may be formed on the surface of the cover plate 5 by means of hot pressing (i.e., heating to a certain temperature or above during the pressing process to make the sheet adhesive liquefy and flow, and the temperature being, for example, 80° C.). Then, the cover plate 5 on which the sealant 4 is formed and the base 1 above which the light-emitting devices 2 are formed are assembled to achieve the encapsulation of the light-emitting devices 2.

In addition, after the sealant 4 is bonded to the base 1, the sealant 4 may be cured by means of ultraviolet irradiation or heating.

Herein, in the process of assembling the cover plate 5 on which the sealant 4 is formed and the base 1 above which the light-emitting devices 2 are formed, a vacuum pressing manner may be used for encapsulation to make the sealant 4 flow and disperse under action of pressure, and it may ensure that the sealant 4 has a good flow and dispersion degree. The sealant 4 can not only be well bonded to the base 1, but also well disperse into the fixing through hole 321. Herein, a viscosity of the sealant 4 may in a range from 10000 mPa·s to 400000 mPa·s. In this way, it is possible to avoid a problem of internal adhesive flow caused by an excessively small viscosity of the sealant 4, and avoid a problem of difficult dispersion of the sealant 4 caused by an excessively large viscosity thereof.

In the embodiments of the present disclosure, by forming the fixing through hole 321 in the second portion 32 of the first fixing component 3, a part of the sealant 4 may disperse and fill the fixing through hole 321 when the light-emitting devices 2 are encapsulated, and a contact area between the sealant 4 and the second portion 32 of the first fixing component 3 may be increased, thereby increasing an adhesive force between the sealant 4 and the second portion 32 of the first fixing component 3, and further preventing the sealant 4 from being peeled off from the base 1.

A shape of the second portion 32 of the first fixing component 3 may be various, which is not limited in the embodiments of the present disclosure, as long as the second portion 32 of the first fixing component 3 can be fixed in the sealant 4.

In the embodiments of the present disclosure, a structure of the second portion 32 of the first fixing component 3 is schematically described by taking an example in which the second portion 32 of the first fixing component 3 has a shape of a right triangular prism.

As shown in FIG. 13, the second portion 32 of the first fixing component 3 includes a first side face 32a and a second side face 32b disposed opposite to each other, and a third side face 32c, a fourth side face 32d and an inclined face 32e that are disposed between the first side face 32a and the second side face 32b and are adjacent to each other.

Herein, the first side face 32a and the second side face 32b have a triangular shape, the third side face 32c, the fourth side face 32d and the inclined face 32e all have a rectangular shape, and the third side face 32c, the fourth side face 32d and the inclined face 32e are all perpendicular to the first side face 32a and the second side face 32b.

In some examples, one of the third side face 32c and the fourth side face 32d is connected to the first portion 31 of the first fixing component 3. An angle between the inclined face 32e and a main surface 1a of the base 1 proximate to the sealant 4 is an acute angle, and the inclined face 32e is arranged to face the light-emitting devices 2. The fixing through hole 321 may penetrate the first side face 32a and the second side face 32b, and may extend in the direction parallel to the base 1.

It will be noted that, a stability of a triangle is better than that of a circle or a rectangle. Therefore, in the embodiments of the present disclosure, the second portion 32 of the first fixing component 3 is configured as a straight triangular prism structure in which the first side face 32a and the second side face 32b both have a triangular shape. In this way, on one hand, an overall stability of the first fixing component 3 may be increased, and a volume occupied by the first fixing component 3 in the sealant 4 may be reduced; on the other hand, during the encapsulation, the sealant 4 may disperse along the inclined face 32e, and compared with structures with other shapes, a "blind region" is not easily formed at the inclined face 32e. In this way, gaps or bubbles at the inclined face 32e may be avoided, which are formed due to insufficient dispersion of the sealant 4, and ensure a good encapsulation effect.

In some examples, the first side face 32a and the second side face 32b both have a shape of a right triangle. In this case, the third side face 32c and the fourth side face 32d are perpendicular to each other. In an example where the third side face 32c is connected to the first portion 31 of the first fixing component 3, an angle between the inclined face 32e and the fourth side face 32d is small, so that an angle between a portion of the sealant 4 at a side of the inclined face 32e facing the light-emitting devices 2 and a portion of the sealant 4 at a side of the fourth side face 32d away from the light-emitting devices 2 is small, thereby causing the adhesive force between the sealant 4 and the second portion 32 of the first fixing component 3 to be large, and preventing the sealant 4 and the second portion 32 of the first fixing component 3 from being separated.

In the embodiments of the present disclosure, a structure of the groove C may be various.

Figure 7:
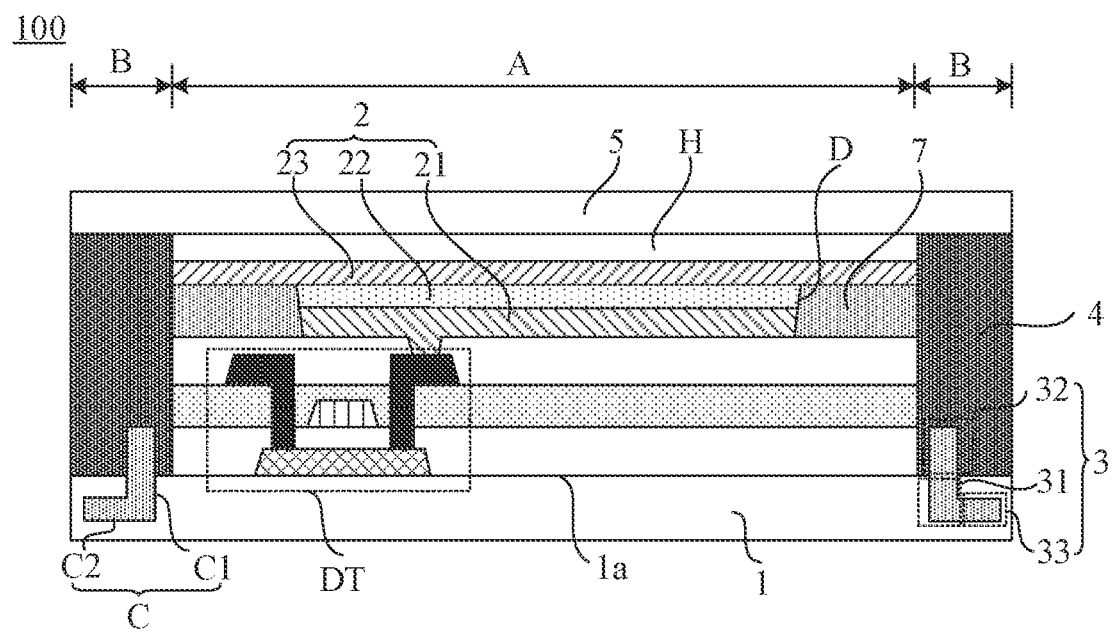
FIG. 7 is another sectional view of the display panel shown in FIG. 5 taken along the direction E-E'.
Figure 8:
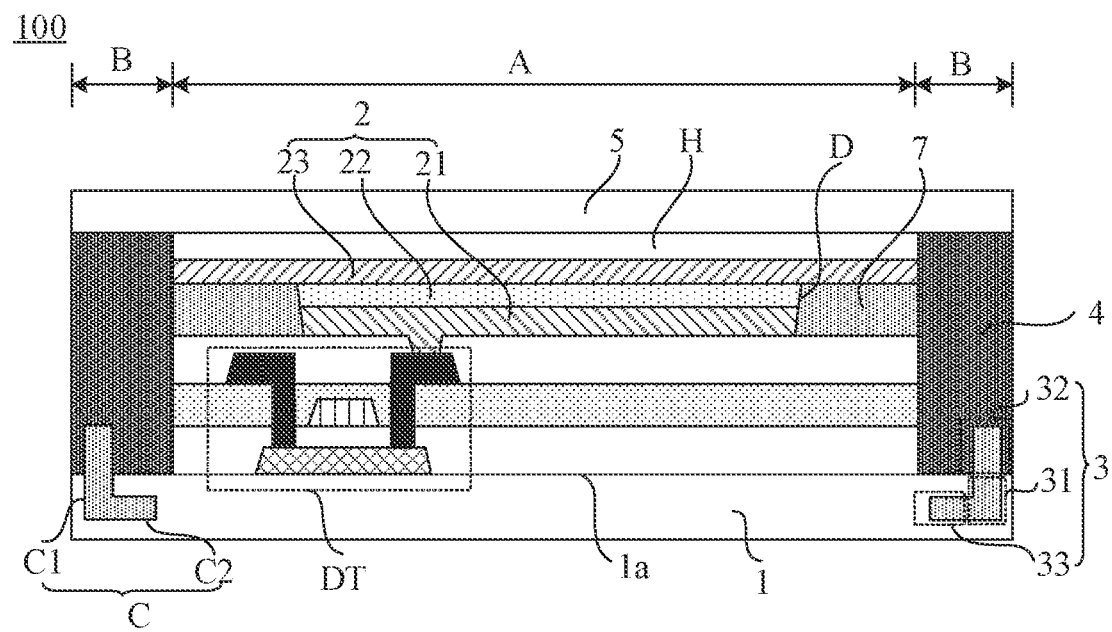
FIG. 8 is yet another sectional view of the display panel shown in FIG. 5 taken along the direction E-E'.

In some embodiments, as shown in FIGS. 7 and 8, the groove C includes a first accommodating portion C1 and a second accommodating portion C2. The first accommodating portion C1 extends from the main surface 1a of the base 1 proximate to the sealant 4 to an inside of the base 1, and the first portion 31 of the first fixing component 3 is embedded in the first accommodating portion C1. The second accommodating portion C2 is located inside the base 1. The second accommodating portion C2 extends in the direction parallel or substantially parallel to the main surface 1a of the base 1 proximate to the sealant 4, and one end of the second accommodating portion C2 is connected to an end of the first accommodating portion C1 extending to the inside of the base 1 (i.e., the first accommodating portion C1 being connected to the second accommodating portion C2).

In some examples, as shown in FIGS. 7 and 8, the first fixing component 3 further includes an extension portion 33, and the extension portion 33 is connected to the first portion 31 and is located in the second accommodating portion C2.

Since the first portion 31 of the first fixing component 3 is embedded in the first accommodating portion C1, and the extension portion 33 is located in the second accommodating portion C2, a shape and a size of the first portion 31 of the first fixing component 3 are adapted to a shape and a size of the first accommodating portion C1, and a shape and a size of the extension portion 33 are adapted to a shape and a size of the second accommodating portion C2.

Herein, the shape of the first accommodating portion C1 and the shape of the second accommodating portion C2 are not limited, and may be selected and set according to needs of users.

For example, orthographic projections of the first accommodating portion C1 and the second accommodating portion C2 on the main surface 1a of the base 1 proximate to the sealant 4 both have a rectangular shape. As shown in FIGS. 7 and 8, the sectional shape of the first accommodating portion C1 and the second accommodating portion C2 is an "L" shape.

In some examples, a depth of each first accommodating portion C1 (i.e., a dimension of each first accommodating portion C1 in the direction perpendicular to the base 1) and a depth of each second accommodating portion C2 (i.e., a dimension of each second accommodating portion C2 in the direction perpendicular to the base 1) may be selected and set according to actual needs.

For example, the depth of each first accommodating portion C1 may range from 0.1 mm to 0.3 mm. In this case, a height of the first portion 31 of the first fixing component 3 (i.e., a dimension of the first portion 31 of the first fixing component 3 in the direction perpendicular to the base 1) may range from 0.1 mm to 0.3 mm. For example, the depth of each first accommodating portion C1 may be 0.2 mm, so that the height of the first portion 31 of the first fixing component 3 may be 0.2 mm; or, the depth of each first accommodating portion C1 may be 0.3 mm, so that the height of the first portion 31 of the first fixing component 3 may be 0.3 mm.

For example, the depth of each second accommodating portion C2 is one third to two thirds of the depth of the first accommodating portion C1. In this case, a height of the extension portion 33 (i.e., a dimension of the extension portion 33 in the direction perpendicular to the base 1) may be one third to two thirds of the height of the first portion 31 of the first fixing component 3. For example, the depth of each second accommodating portion C2 may be 0.04 mm, and the height of the extension portion 33 may be 0.04 mm; or, the depth of each second accommodating portion C2 may be 0.2 mm, and the height of the extension portion 33 may be 0.2 mm.

By setting the depth of each first accommodating portion C1 and the depth of each second accommodating portion C2 within the above numerical range, it is possible to prevent the first portion 31 and the extension portion 33 of the first fixing component 3 from being separated from the groove C, and it is also possible to avoid affecting firmness of the base 1, and prevent the base 1 from cracking due to the groove C.

In some examples, a width of each first accommodating portion C1 (i.e., a dimension of each first accommodating portion C1 in an extending direction of the second accommodating portion C2) and a width of each second accommodating portion C2 (i.e., a dimension of each second accommodating portion C2 in its extending direction) may be selected and set according to actual needs.

For example, the width of each first accommodating portion C1 may range from 0.5 mm to 2 mm. In this case, a width of the first portion 31 of the first fixing component 3 (i.e., a dimension of the first portion 31 of the first fixing component 3 in the extending direction of the second accommodating portion C2) may range from 0.5 mm to 2 mm. For example, the width of each first accommodating portion C1 may be 1 mm, and the width of the first portion 31 of the first fixing component 3 may be 1 mm; or, the width of each first accommodating portion C1 may be 1.5 mm, and the width of the first portion 31 of the first fixing component 3 may be 1.5 mm.

For example, the width of each second accommodating portion C2 may range from 0.5 mm to 2 mm. In this case, a width of the extension portion 33 (i.e., a dimension of the extension portion 33 in the extending direction of the second accommodating portion C2) may range from 0.5 mm to 2 mm. For example, the width of each second accommodating portion C2 may be 1 mm, and the width of the extension portion 33 may be 1 mm; or, the width of each second accommodating portion C2 may be 2 mm, and the width of the extension portion 33 may be 2 mm.

By setting the width of each first accommodating portion C1 and the width of each second accommodating portion C2 within the above numerical range, it is possible to ensure an accuracy of forming the first accommodating portion C1 and the second accommodating portion C2, and it is also possible to prevent the first accommodating portion C1 and the second accommodating portion C2 from occupying a large area in the frame area B, and avoid affecting development of a narrow bezel of the display panel 100.

In addition, a height of the second portion 32 of the first fixing component 3 (i.e., a dimension of the second portion 32 in the direction perpendicular to the base 1) may be selected and set according to actual needs. For example, the height of the second portion 32 of the first fixing component 3 may range from 5 μm to 10 μm. For example, the height of the second portion 32 of the first fixing component 3 may be 5 μm, 7 μm, 8 μm, or 10 μm.

There are various positional relationships between the extension portion 33 and the first portion 31 of the first fixing component 3. For example, as shown in FIG. 7, the extension portion 33 may be located at a side of the first portion 31 of the first fixing component 3 away from the display area A; or, as shown in FIG. 8, the extension portion 33 may be located at a side of the first portion 31 of the first fixing component 3 proximate to the display area A.

In some examples, the extension portion 33, the first portion 31 of the first fixing component 3, and the second portion 32 of the first fixing component 3 are integrally formed. That is, they are of an integrated structure, which is advantageous for simplifying the manufacturing processes of the display panel 100.

Figure 12:
FIG. 12 is a force analysis diagram of a first fixing component, in accordance with some embodiments of the present disclosure.

In the embodiments of the present disclosure, on one hand, by providing the extension portion 33 and embedding the extension portion 33 in the second accommodating portion C2, an entire first fixing component 3 may be further firmly embedded in the base 1, and a risk that the first fixing component 3 is separated from the base 1 may be effectively reduced or even eliminated; and on the other hand, by providing the second portion 32 of the first fixing component 3, the first portion 31 of the first fixing component 3, and the extension portion 33 to be of an integrated structure, in a case where the second portion 32 of the first fixing component 3 is subjected to an external force (e.g., a shear force shown in FIG. 12) (i.e., in a case where the sealant 4 is subjected to an external force), the extension portion 33 can receive a downward force from the base 1. As a result, the force that the sealant 4 is subjected to may be shared by using the first fixing component 3 to reduce the force that the sealant 4 is subjected to, and it is possible to prevent the sealant 4 from cracking at a position where it is connected to the second portion 32 of the first fixing component 3 or at a position where it is connected to the base 1.

In some embodiments, as shown in FIGS. 9 to 11, there is an infiltration through hole 6 disposed between the main surface 1a of the base 1 proximate to the sealant 4 and the second accommodating portion C2, and the infiltration through hole 6 exposes the extension portion 33.

In some examples, an orthographic projection of the infiltration through hole 6 on the main surface 1a of the base 1 proximate to the frame sealant 4 is within a range of an orthographic projection of the extension portion 33 on the main surface 1a of the base 1 proximate to the sealant 4.

Herein, a forming manner of the infiltration through hole 6 is not limited. The forming manner of the infiltration through hole 6 is related to a shape of the first fixing component 3 and a material of the base 1.

For example, the infiltration through hole 6 is formed by using a wet etching process.

By providing the infiltration through hole 6, it is possible to discharge gas by using the infiltration through hole 6 in a process of forming the first fixing component 3, to ensure that the material for forming the first fixing component 3 can gradually disperse into the second accommodating portion C2, and to prevent bubbles from being generated in the extension portion 33 or the first portion 31 of the first fixing component 3.

In some embodiments, as shown in FIGS. 9 to 11, the first fixing component 3 further includes an infiltration portion 34 disposed in the infiltration through hole 6, and the infiltration portion 34 is connected to the extension portion 33. For example, the infiltration portion 34 and the extension portion 33 are integrally formed. That is, the material for forming the first fixing component 3 may further gradually disperse into the infiltration through hole 6 in a process in which it gradually disperses into the second accommodating portion C2. In this way, it is possible to completely discharge the gas in the groove C, and bubbles may be effectively avoided in the process of forming the first fixing component 3.

In some examples, as shown in FIG. 10, the infiltration through hole 6 is located at a side of the first accommodating portion C1 away from the display area A. In this way, in the process where the material for forming the first fixing component 3 disperses into the groove C, it is possible to ensure that the gas in the groove C can be smoothly discharged through the infiltration through hole 6.

In some embodiments, as shown in FIGS. 6 to 11, the display panel 100 further includes a pixel defining layer 7 disposed at a side of the base 1 with the at least one groove C, and the pixel defining layer 7 has a plurality of openings D. At least a part of the light-emitting layer 22 of each light-emitting device 2 is located in an opening D. And light-emitting layers 22 of any two adjacent light-emitting devices 2 are separated from each other, and are not connected. Herein, each opening D is provided with at least a part of a light-emitting layer 22 of a light-emitting device 2 therein.

In some examples, the first fixing component 3 is made of a same material and disposed in a same layer as the pixel defining layer 7.

It will be noted that, the "same layer" mentioned herein refers to a layer structure with specific patterns formed by performing a patterning process on a film, which is formed by using a same film-forming process, by using a same mask. Depending on different specific patterns, the patterning process may include multiple exposure, development or etching processes, and the specific patterns formed in the layer structure may be continuous or discontinuous, and these specific patterns may also be at different heights or have different thicknesses. In this way, the first fixing component 3 and the pixel defining layer 7 may be simultaneously formed, which is advantageous for simplifying the manufacturing processes of the display panel 100.

The material for forming the first fixing component 3 is not limited in the embodiments of the present disclosure, as long as the first fixing component 3 is not easily broken under action of force.

For example, the material of the first fixing component 3 may be a photoresist, and in this case, the material of the pixel defining layer 7 may also be a photoresist.

In some embodiments, as shown in FIGS. 6 to 11, the display panel 100 further includes a protective layer H disposed at a side of the pixel defining layer 7 away from the base 1. The first fixing component 3 may further be made of a same material and disposed in a same layer as the protective layer H.

In the embodiments of the present disclosure, a position of the first fixing component 3 in the frame area B may be selected according to actual needs.

For example, in a case where there is one first fixing component 3 included in the display panel 100, the first fixing component 3 may be located at any position in the frame area B.

Figure 2:
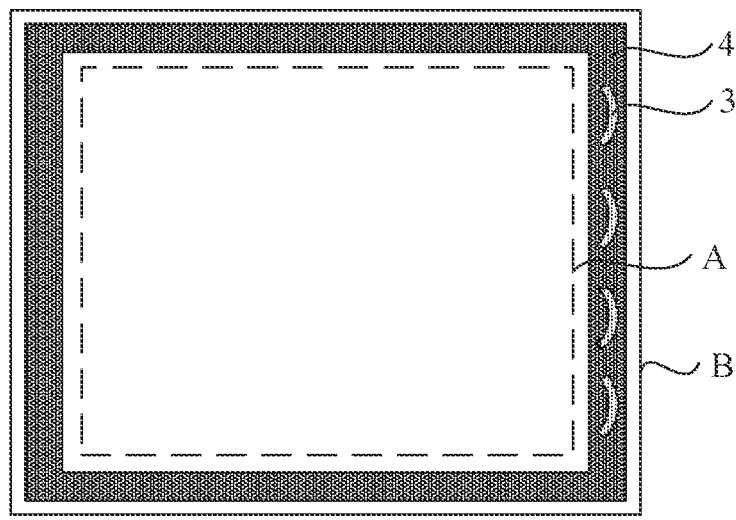
FIG. 2 is a diagram showing a structure of a display panel, in accordance with some embodiments of the present disclosure.
Figure 3:
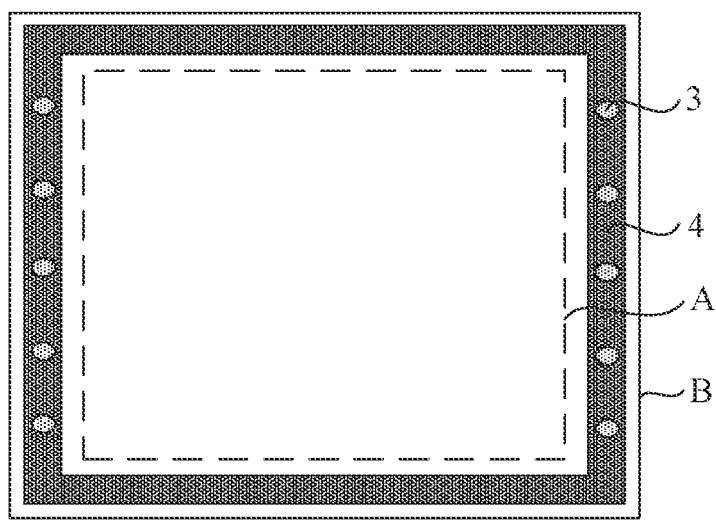
FIG. 3 is a diagram showing a structure of another display panel, in accordance with some embodiments of the present disclosure.
Figure 4:
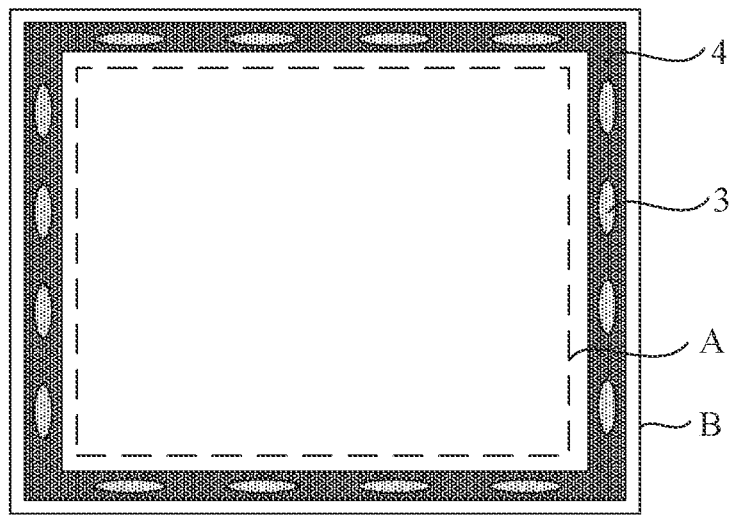
FIG. 4 is a diagram showing a structure of yet another display panel, in accordance with some embodiments of the present disclosure.
Figure 5:
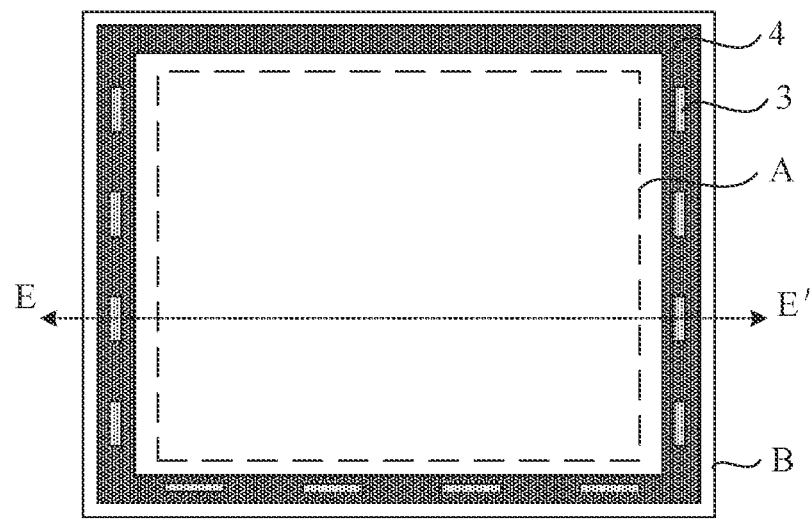
FIG. 5 is a diagram showing a structure of yet another display panel, in accordance with some embodiments of the present disclosure.
Figure 6:
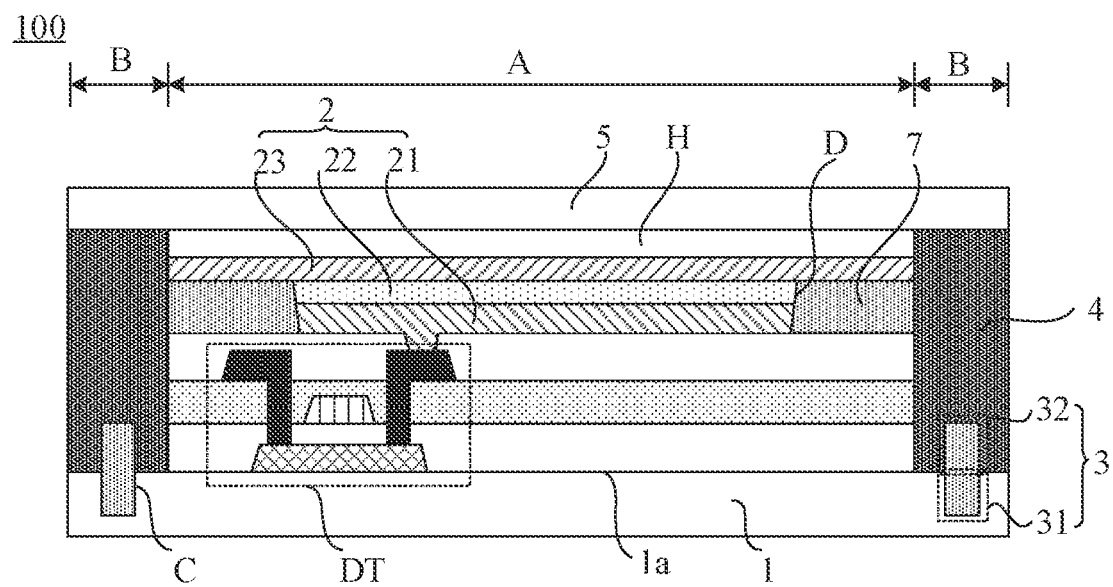
FIG. 6 is a sectional view of the display panel shown in FIG. 5 taken along direction E-E'.

For example, in a case where there are a plurality of first fixing components 3 included in the display panel 100, the plurality of first fixing components 3 may be located at at least one side of the display area A, for example, one side of the display area A (as shown in FIG. 2), or two sides of the display area A (as shown in FIG. 3), or three sides of the display area A (as shown in FIG. 5), or the periphery of the display area A (as shown in FIG. 4). In addition, the plurality of first fixing components 3 may further be located on at at least one corner of the display area A. For example, if the display area A has a rectangular shape, the plurality of first fixing components 3 are located at four corners of the display area A.

In the case where there are a plurality of first fixing components 3, a distance between two adjacent first fixing components 3 may be selected and set according to actual needs. For example, the distance between two adjacent first fixing components 3 may be 1 mm, 5 mm, 10 mm, etc. In addition, the plurality of first fixing components 3 may further be evenly distributed. That is, the distance between any two adjacent first fixing components 3 is the same.

Of course, two adjacent first fixing components 3 may be adjacent and connected.

In some embodiments, a shape of an orthographic projection of the first fixing component 3 on the main surface 1*a* of the base 1 proximate to the sealant 4 may be various, which is related to a process of forming the first fixing component 3 and the needs of the users.

For example, the orthographic projection of the first fixing component 3 on the main surface 1*a* of the base 1 proximate to the sealant 4 may have an arched shape (as shown in FIG. 2), a circular shape (as shown in FIG. 3), a rectangular shape (as shown in FIG. 5) or an elliptic shape (as shown in FIG. 4). For example, in a case where the second portion 32 of the first fixing component 3 has a shape of a right triangular prism, the orthographic projection of the first fixing component 3 on the main surface 1*a* of the base 1 proximate to the sealant 4 may have a rectangular shape shown in FIG. 5.

Herein, a size of the orthographic projection of the first fixing component 3 on the main surface 1*a* of the base 1 proximate to the sealant 4 may be selected and set according to actual needs, as long as the sealant 4 can cover a surface of the second portion 32 of the first fixing component 3, and the second portion 32 of the first fixing component 3 is completely embedded in the sealant 4.

For example, in an example where the orthographic projection of the first fixing component 3 on the main surface 1*a* of the base 1 proximate to the sealant 4 has a circular shape, a diameter of the orthographic projection of the first fixing component 3 on the main surface 1*a* of the base 1 proximate to the sealant 4 ranges from 0.5 mm to 2 mm. For example, the diameter of the orthographic projection of the first fixing component 3 on the main surface 1*a* of the base 1 proximate to the sealant 4 is 1 mm.

In some embodiments, as shown in FIG. 11, the display panel 100 further includes a second fixing component 8 adjacent to the first fixing component 3, and the second fixing component 8 is disposed at a side of the first fixing component 3 proximate to the display area A.

In some examples, the second fixing component 8 and the first fixing component 3 are mirror-symmetrical with respect to a plane located between the second fixing component 8 and the first fixing component 3 and perpendicular to the base 1, and a portion of the second fixing component 8 that is mirror-symmetrical to the second portion 32 of the first fixing component 3 is embedded in the sealant 4.

Herein, a structure, a material and a shape of the second fixing component 8 are the same as those of the first fixing component 3. With respect to the description of the second fixing component 8, reference may be made to the description of the first fixing component 3.

In the embodiments of the present disclosure, the first fixing component 3 may be subjected to a force from a side of the first fixing component 3 away from the second fixing component 8, and the second fixing component 8 may be subjected to a force from a side of the second fixing component 8 away from the first fixing component 3. The first fixing component 3 and the second fixing component 8 can cooperate with each other, which may effectively reduce a force applied on the sealant 4 in the direction perpendicular to the base 1, and prevent the sealant 4 from cracking at a position where it contacts the first fixing component 3 and the second fixing component 8 and at a position where it contacts the base 1.

Some embodiments of the present disclosure provide a method for manufacturing a display panel. As shown in FIG. 14, the method for manufacturing the display panel includes S100 to S500.

Figure 17:
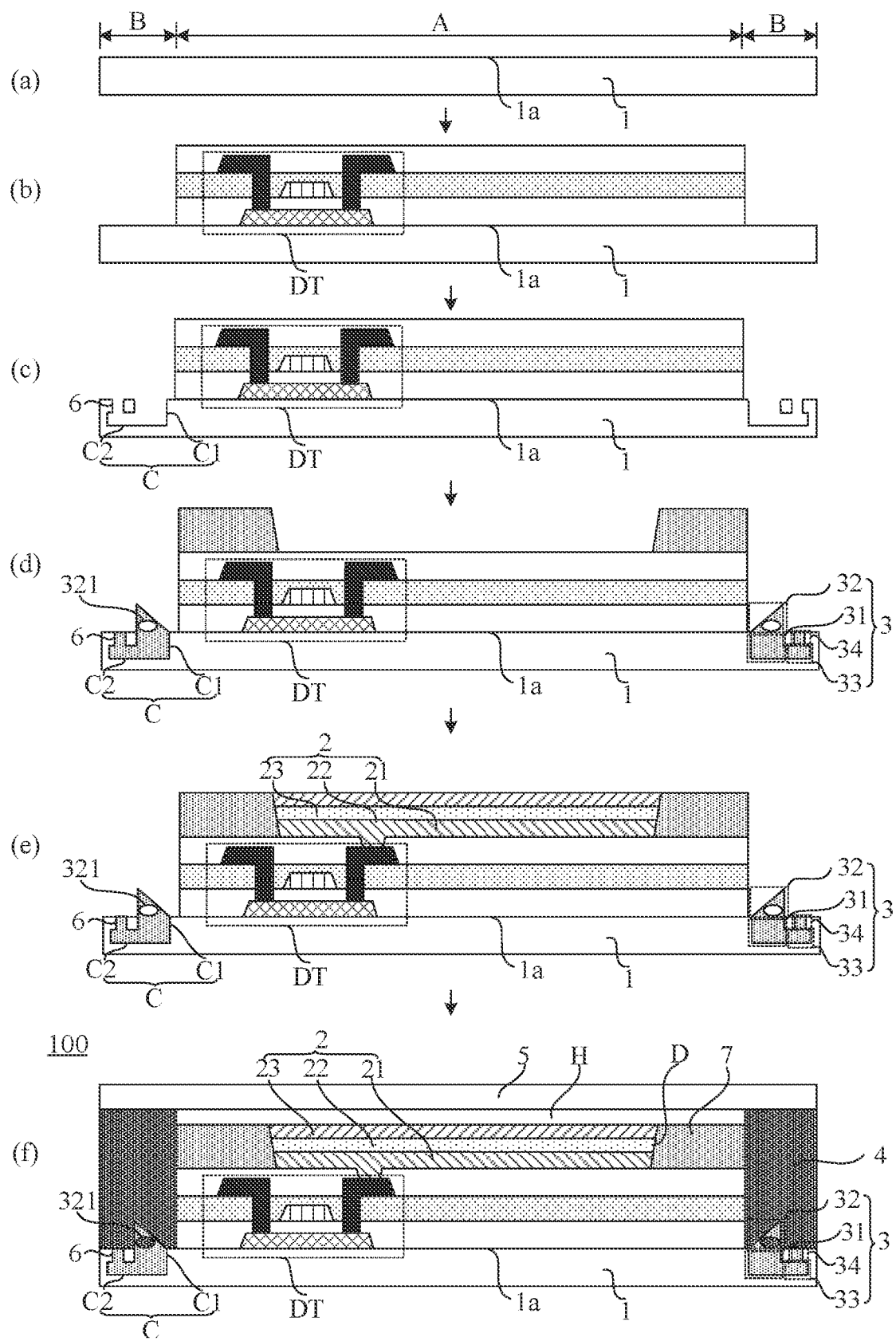
FIG. 17 is a diagram showing steps for manufacturing a display panel, in accordance with some embodiments of the present disclosure.

In S100, as shown in part (a) in FIG. 17, a base 1 is provided. The base 1 has a display area A and a frame area B located at at least one side of the display area A.

In S200, as shown in part (c) in FIG. 17, at least one groove C is formed on a side of the base 1. The at least one groove C is located in the frame area B.

Herein, a manner of forming the groove C is related to a material of the base 1 and a shape of the groove C.

For example, the groove C may be formed by using a wet etching process.

A structure of each groove C is related to a structure of the base 1. For example, in a case where the base 1 is a blank substrate, each groove C extends from a surface of the substrate to an inside of the base substrate; or, in a case where the base 1 includes a blank substrate and at least one functional film (e.g., a buffer layer), each groove C penetrates the at least one functional film and extends to the inside of the substrate.

In addition, a type of the base 1 is related to a type of the display panel 100. For example, in a case where the display panel 100 is a flexible display panel, a material of a base substrate in the base 1 may include a flexible material, such as PI; and in a case where the display panel 100 is a rigid display panel, a material of the base substrate in the base 1 may include a rigid material, such as glass or quartz.

In some examples, as shown in part (b) in FIG. 17, the method for manufacturing the display panel further includes: forming a driver circuit on a side of the base 1. The driver circuit includes a driving transistor DT, at least one switching transistor and at least one storage capacitor.

In S300, as shown in part (d) in FIG. 17, at least one first fixing component 3 is formed at the side of the base 1 where the at least one groove C has been formed. Each first fixing component 3 includes a first portion 31 and a second portion 32, and the first portion 31 of the first fixing component 3 is embedded in a groove C.

Herein, in the case where the base 1 is the blank substrate, the first portion 31 of the first fixing component 3 is embedded in the substrate; and in the case where the base 1 includes the blank substrate and the at least one functional film, the first portion 31 of the first fixing component 3 is embedded in the at least one functional film and the substrate.

In the embodiments of the present disclosure, a position of the first fixing component 3 in the frame area B may be selected and set according to actual needs.

For example, there are one or more first fixing components 3 formed at aside of the base 1.

For example, in a case where there is one first fixing component 3, the first fixing component 3 may be located at any position in the frame area B.

For another example, in a case where there are a plurality of first fixing components 3, the plurality of first fixing components 3 may be located at at least one side of the display area A, for example, one side of the display area A (as shown in FIG. 2), or two sides of the display area A (as shown in FIG. 3), or three sides of the display area A (as shown in FIG. 5), or the periphery of the display area A (as shown in FIG. 4).

In the case where there are a plurality of first fixing components 3, a distance between two adjacent first fixing components 3 may be selected and set according to actual needs. For example, the distance between two adjacent first fixing components 3 may be 1 mm, 5 mm, or 10 mm. In addition, the plurality of first fixing components 3 may further be evenly distributed. That is, the distance between any two adjacent first fixing components 3 is the same.

Of course, two adjacent first fixing components 3 may be adjacent and connected.

In some examples, a shape of an orthographic projection of the first fixing component on a surface of the base 1 may be various, which is related to a process of forming the first fixing component 3 and needs of users.

For example, the orthographic projection of the first fixing component 3 on the surface of the base 1 may have an arched shape (as shown in FIG. 2), a circular shape (as shown in FIG. 3), a rectangular shape (as shown in FIG. 5) or an elliptic shape (as shown in FIG. 4).

Herein, a size of the orthographic projection of the first fixing component 3 on the surface of the base 1 may be selected and set according to actual needs.

For example, in an example where the orthographic projection of the first fixing component 3 on the surface of the base 1 has a circular shape, a diameter of the orthographic projection of the first fixing component 3 on the surface of the base 1 may range from 0.5 mm to 2 mm. For example, the diameter of the orthographic projection of the first fixing component on the surface of the base 1 may be 1 mm or 2 mm.

In S400, as shown in part (e) in FIG. 17, a plurality of light-emitting devices 2 are formed at a side of the base 1 where the at least one groove C has been formed. The plurality of light-emitting devices 2 are located in the display area A.

As shown in part (e) in FIG. 17, a light-emitting device 2 may include a first electrode 21, a light-emitting layer 22, and a second electrode 23 that are sequentially stacked.

It will be noted that, the above reference signs of the steps (e.g., S300 or S400) are only to clearly describe contents of the steps, and are not to limit a sequence of the steps for manufacturing the display panel 100, and the sequence of the steps for manufacturing the display panel 100 may be set according to actual needs.

Herein, a sequence of forming the light-emitting device 2 and forming the first fixing component 3 may be selected and set according to actual needs. For example, the light-emitting device 2 may be formed first, and then the first fixing component 3 is formed. For another example, the first fixing component 3 is formed first, and then the light-emitting device 2 is formed. For yet another example, the first electrode 21 of the light-emitting device 2 is formed first, and then a pixel defining layer 7 and the first fixing component 3 are formed through a same patterning process, and then the light-emitting layer 22 and the second electrode 23 of the light-emitting device 2 are sequentially formed.

In S500, as shown in part (f) in FIG. 17, a sealant 4 is formed and the sealant 4 is located at the side of the base 1 where the at least one groove C has been formed. The sealant 4 is located at least in the frame area B, and the second portion 32 of the first fixing component 3 is embedded in the sealant 4.

Herein, the sealant 4 may only be disposed in the frame area B. In this case, the sealant 4 is in a shape of a closed ring and surrounds a periphery of the plurality of light-emitting devices 2. Or, on this basis, the sealant 4 may further be disposed in the display area A. In this case, the sealant 4 not only surrounds the periphery of the plurality of light emitting-devices 2, but also covers surfaces of the plurality of light-emitting devices 2 away from the base 1.

A material of the sealant 4 may include various materials. The material of the sealant 4 is not limited in the present example, as long as the sealant 4 may well encapsulate the plurality of light-emitting devices 2 and prevent moisture and/or oxygen from entering the plurality of light-emitting devices 2.

For example, the material of the sealant 4 may include epoxy resin. In addition, on this basis, the material of the sealant 4 may further include a homopolymer or a copolymer of monomers such as glycidyl acrylate, glycidyl methacrylate, methyl methacrylate, ethyl methacrylate, n-butyl methacrylate, 6,7-epoxyheptyl methacrylate or 2-hydroxyethyl methacrylate, and an additive material such as melamine formaldehyde resin, unsaturated polyester resin, organic silicone resin, or furan resin.

In some examples, S500, in which a sealant 4 is formed and the sealant 4 is located at the side of the base 1 where the at least one groove C has been formed, includes: forming a sealant 4 on a side of a cover plate 5, and assembling the cover plate 5 on which the sealant 4 has been formed and the base 1 above which the plurality of light-emitting devices 2 have been formed.

Herein, the cover plate 5 covers at least the surfaces of the plurality of light-emitting devices 2 away from the base 1. In addition, on this basis, the cover plate 5 may further cover the periphery of the plurality of light-emitting devices 2.

A type of the cover plate 5 is related to the type of the display panel 100. For example, in the case where the display panel 100 is the flexible display panel, the cover plate 5 may be a flexible cover plate, and a material thereof may be PI; and in the case where the display panel 100 is the rigid display panel, the cover plate 5 may be a rigid cover plate, and a material thereof may be glass or quartz.

There are various relative positional relationships between the cover plate 5 and the sealant 4.

For example, in a case where the cover plate 5 and the sealant 4 both cover the surfaces of the plurality of light-emitting devices 2 away from the base 1, the cover plate 5 may be disposed at a side of the sealant 4 proximate to the plurality of light-emitting devices, or may be disposed at a side of the sealant 4 away from the plurality of light-emitting devices 2.

For example, in a case where the cover plate 5 and the sealant 5 both surround the periphery of the plurality of light-emitting devices 2, the cover plate 5 may be disposed at a side of the sealant 4 proximate to the plurality of light-emitting devices 2 or may be disposed at a side of the sealant 4 away from the plurality of light-emitting devices 2.

There are various processes of forming the sealant 4 on aside of the cover plate 5, which are related to a type of the sealant 4.

For example, the sealant 4 may be a sheet adhesive. In this case, the sealant 4 may be formed on a side of the cover plate 5 by using a hot pressing process.

For example, the sealant 4 may be a liquid adhesive. In this case, the sealant 4 may be formed on a side of the cover plate 5 by using a dispensing process or a coating process.

In some examples, in a process of assembling the cover plate 5 on which the sealant 4 has been formed and the base 1 above which the plurality of light-emitting devices 2 have been formed, they may be assembled in a vacuum pressing manner to encapsulate the plurality of light-emitting devices 2, thereby ensuring a dispersion degree of the sealant 4. Herein, a viscosity of the sealant 4 may range from 10000 mPa·s to 400000 mPa·s. In this way, it is possible to avoid a problem of internal adhesive flow caused by an excessively small viscosity of the sealant 4, and avoid a problem of difficult dispersion of the sealant 4 caused by an excessively large viscosity thereof.

In addition, after the cover plate 5 on which the sealant 4 has been formed and the base 1 above which the plurality of light-emitting devices 2 have been formed are assembled, and after the sealant 4 sufficiently disperses, the sealant 4 may be cured through ultraviolet irradiation or heating.

The second portion 32 of the first fixing component 3 is embedded in the sealant 4. That is, the second portion 32 of the first fixing component 3 is located inside the sealant 4, and is firmly fixed in the sealant 4, and is difficult to be separated from the sealant 4.

The method for manufacturing the display panel provided by the embodiments of the present disclosure can achieve same beneficial effects as the display panel 100 provided by some embodiments described above, and details will not be repeated herein.

Herein, with respect to a structure of the first portion 31 and a structure of the second portion 32 in the first fixing component 3, reference may be made to the description of the first portion 31 and the second portion 32 of the first fixing component 3 in some embodiments described above.

In some embodiments, as shown in FIG. 15, S200, in which at least one groove C is formed on a side of the base 1, includes S210 to S230. The present embodiments are schematically described by taking an example in which the base 1 is a base substrate.

Figure 18:
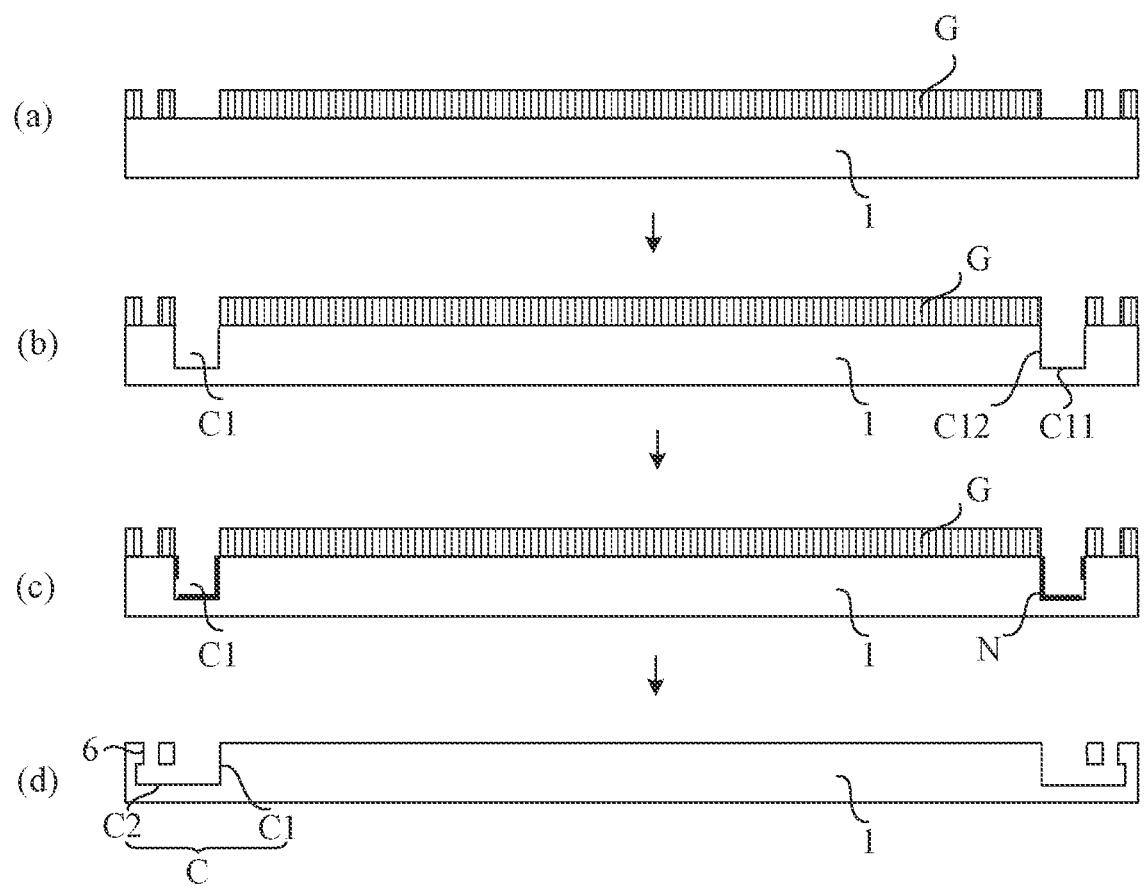
FIG. 18 is a diagram showing steps for manufacturing grooves, in accordance with some embodiments of the present disclosure.

In S210, referring to parts (a) and (b) in FIG. 18, a photoresist pattern G is formed on a side of the base 1, and the base 1 is etched by using the photoresist pattern G as a mask to form at least one first accommodating portion C1. Each first accommodating portion C1 includes a bottom wall C11 and a side wall C12 connected to the bottom wall C11.

The present examples are schematically described by taking an example in which the photoresist pattern G is formed on a side of the base 1 as shown in FIG. 18.

In some examples, the step of forming the photoresist pattern G on a side of the base 1 includes: providing a photoresist on the side of the base 1, and exposing and developing the photoresist to form the photoresist pattern G.

Herein, the photoresist may be a positive photoresist or a negative photoresist. A photoresist pattern G formed by using the positive photoresist and a photoresist pattern G formed by using the negative photoresist have opposite characteristics.

A depth of the first accommodating portion C1 may be selected and set according to actual needs. For example, the depth of the first accommodating portion C1 may range from 0.1 mm to 0.3 mm. For example, the depth of the first accommodating portion C1 may be 0.1 mm, 0.2 mm, or 0.3 mm.

In some examples, the base 1 may be etched by using an etching solution including, for example, hydrofluoric acid to form at least one first accommodating portion C1.

In S220, as shown in part (c) in FIG. 18, a corrosion-resistant film N is formed on a first region of the side wall C12 and the bottom wall C11. The corrosion-resistant film exposes a second region of the side wall C12. The second region of the side wall C12 is connected to the bottom wall C11, and there is a distance between the second region of the side wall C12 and a main surface 1a of the base 1 proximate to the sealant 4.

In some examples, a depth of a second accommodating portion C2 is one third to two thirds of the depth of the first accommodating portion C1. And, the distance between the second region of the side wall C12 and the main surface 1a of the base 1 proximate to the sealant 4 is one third to two thirds of the depth of the first accommodating portion C1. For example, the distance between the second region of the side wall C12 and the main surface 1a of the base 1 proximate to the sealant 4 in a direction perpendicular to the base 1 may be 0.04 mm, 0.07 mm, 0.1 mm or 0.2 mm.

In some examples, a length of an intersection line between the second region of the side wall C12 and the bottom wall C1 is less than a length of an intersection line between the side wall C12 and the bottom wall C11 (i.e., a perimeter of the bottom wall C).

Herein, a shape of the second region of the side wall C12 is related to a shape of the first accommodating portion C1, and the shape of the first accommodating portion C1 is related to a process of forming the first accommodating portion C1.

For example, if the first accommodating portion C1 has a cuboid shape, the second region of the side wall C12 may have a rectangular shape; and if the first accommodating portion C1 has a cylindrical shape, the second region of the side wall C12 may have a shape of a cambered surface.

Herein, in a case where the second region of the side wall C12 has the shape of the cambered surface, a central angle of an arc of the cambered surface is less than 360°. For example, the central angle of the arc of the cambered surface is 90°.

A type of the corrosion-resistant film is not limited in the present examples, as long as the second region C12 of the first accommodating portion C1 and the bottom wall C11 are not etched by the etching solution when the second region of the side wall C12 is etched subsequently.

For example, the corrosion-resistant film is an acid-resistant film. For example, a material of the acid-resistant film may be paraffin wax.

In S300, as shown in part (d) in FIG. 18, the second region of the side wall C12 is etched by using the wet etching process to form the second accommodating portion C2. The second accommodating portion C2 extends in a direction parallel or substantially parallel to the main surface 1a of the base 1 proximate to the sealant 4, and one end of is connected with the first accommodating portion C1.

Herein, with respect to a structure of the second accommodating portion C2, reference may be made to the description of the structure of the second accommodating portion C2 in some embodiments described above. In the embodiments of the present disclosure, the process for forming the groove including the first accommodating portion C1 and the second accommodating portion C2 is simple and easy to implement.

In addition, in a case where an infiltration through hole 6 is disposed between the main surface 1a of the base 1 proximate to the sealant 4 and the second accommodating portion C2, the infiltration through hole 6 may be formed at a same time when the second accommodating portion C2 is formed by using the wet etching process.

In some embodiments, S400, in which a plurality of light-emitting devices 2 are formed, includes: forming light-emitting layers 22 of the plurality of light-emitting devices 2.

As shown in FIG. 16, before the light-emitting layers 22 are formed, the method for manufacturing the display panel further includes S410 and S420.

Figure 19:
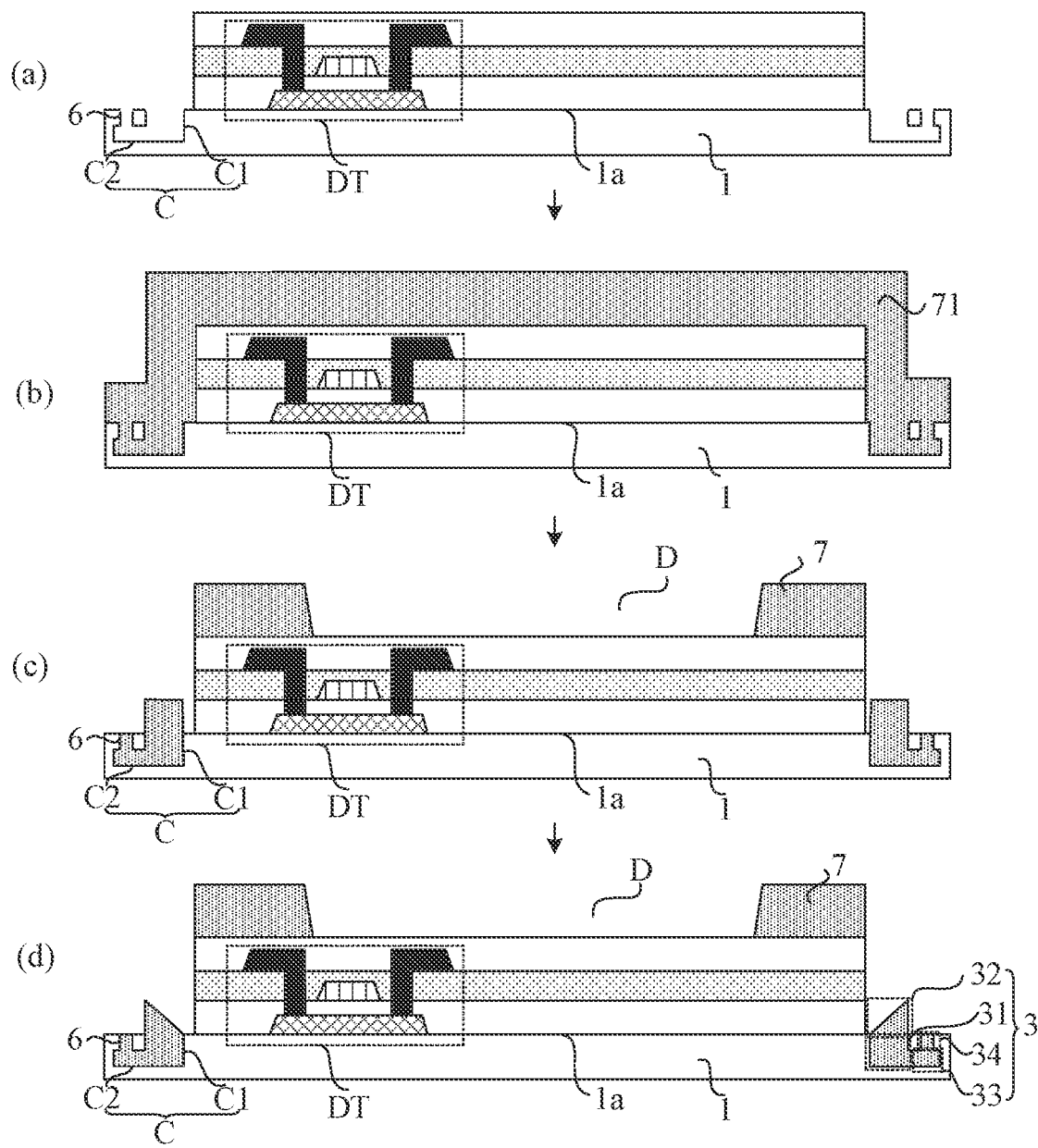
FIG. 19 is a diagram showing steps for forming a pixel defining layer and a first fixing component, in accordance with some embodiments of the present disclosure.

In S410, as shown in parts (a) and (b) in FIG. 19, a pixel defining film 71 is formed at a side of the base 1 on which the at least one groove C has been formed.

For example, the pixel defining film 71 may be formed by using a coating process (e.g., spin coating or spray coating). A material of the pixel defining film 71 may include a photoresist.

In S410, as shown in parts (c) and (d) in FIG. 19, the pixel defining film 71 is patterned to form a plurality of openings D located in the display area A and the at least one first fixing component 3 located in the frame area B. Each first fixing component 3 includes: the first portion 31 embedded in the first accommodating portion C1, an extension portion 33 located in the second accommodating portion C2, and the second portion 32 protruding with respect to the main surface 1a of the base 1.

In some examples, S410, in which a plurality of openings D located in the display area A and the at least one first fixing component 3 located in the frame area B are formed, includes: forming a half-tone mask at a side of the pixel defining film 71 away from the base 1. The half-tone mask includes a completely-retaining region, a semi-retaining region, and a completely-removing region. The completely-retaining region corresponds to a pixel defining layer to be formed, the semi-retaining region corresponds to at least one first fixing component to be formed, and the completely-removing region corresponds to a plurality of openings to be formed. S410 includes, then, forming a plurality of openings D in the display area A after the pixel defining film 71 is exposed and developed, i.e., forming a pixel defining layer 7; and then, ashing the half-tone mask to expose the first fixing component to be formed, and forming the second portion 32 of the first fixing component 3 by adjusting an exposure angle (for example, in a case where the second portion 32 of the first fixing component 3 has a shape of a right triangular prism, an inclined face 32e of the right triangular prism is formed).

Herein, a portion of the pixel defining film 71 located in the display area A may be referred to as the pixel defining layer 7 after the plurality of openings D are formed. That is, the first fixing component 3 and the pixel defining layer 7 are formed through a same patterning process. In this way, the manufacturing process of the display panel may be simplified.

Figure 20:
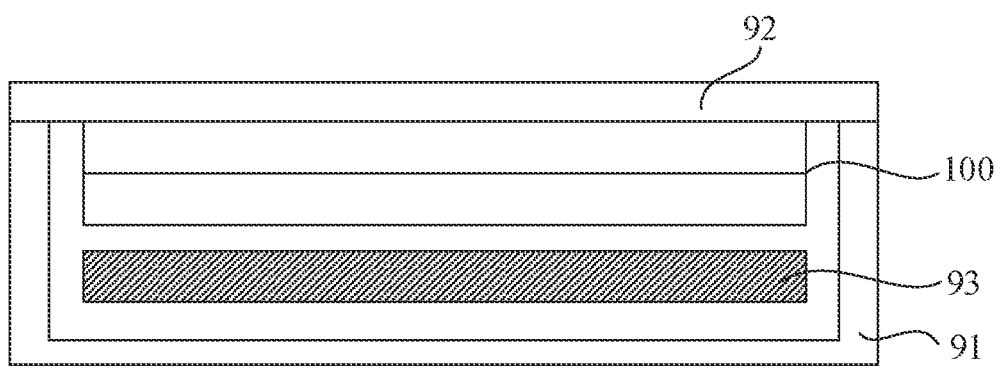
FIG. 20 is a diagram showing a structure of a display device, in accordance with some embodiments of the present disclosure.
Figure 21:
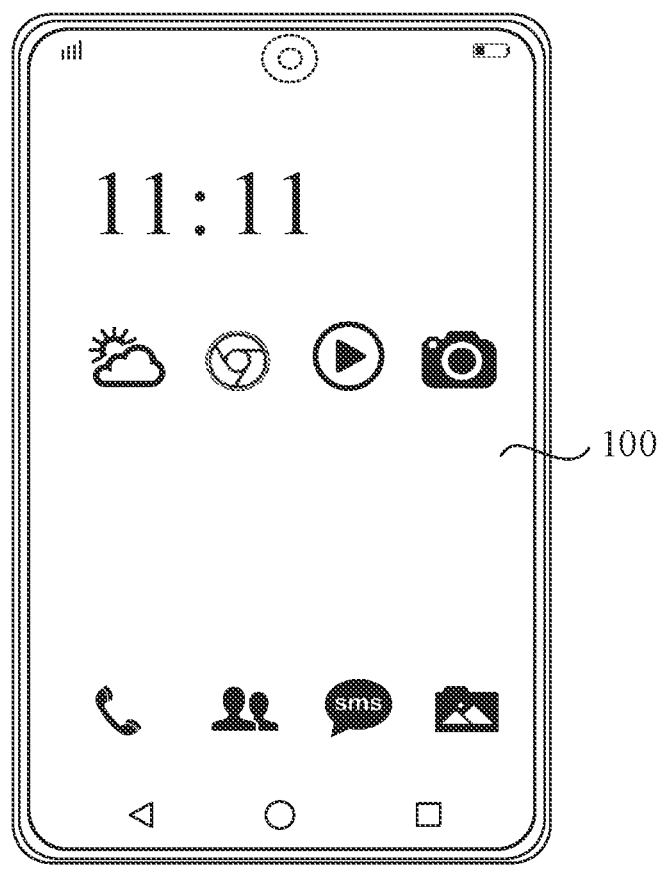
FIG. 21 is a diagram showing a structure of another display device, in accordance with some embodiments of the present disclosure.

Some embodiments of the present disclosure provide a display device 200. As shown in FIGS. 20 and 21, the display device 200 includes the display panel 100 described in some embodiments described above.

The display panel 100 included in the display device 200 provided by the embodiments of the present disclosure has a same structure and same beneficial effects as the display panel 100 provided in some embodiments described above. Since the structure and the beneficial effects of the display panel 100 have been described in detail in some embodiments described above, details will not be repeated herein.

In some embodiments, as shown in FIG. 20, the display device 200 may further include, for example, a frame 91, a glass cover plate 92, a circuit board 93, and other electronic accessories including a camera.

There are various light-emitting manners of the display device 200. For example, the light-emitting manner of the display device 200 may be top emission, bottom emission or double-sided emission.

In an example where the light-emitting manner of the display device 200 is the top emission, a section of the frame 91 may be U-shaped. As shown in FIG. 20, the display panel 100, the circuit board 93 and other electronic accessories may be disposed in the frame 91, the glass cover plate 92 is disposed at a light-exit side of the display panel 100, and the circuit board 93 is disposed at a side of the display panel 100 away from the glass cover plate 92.

Figure 22:
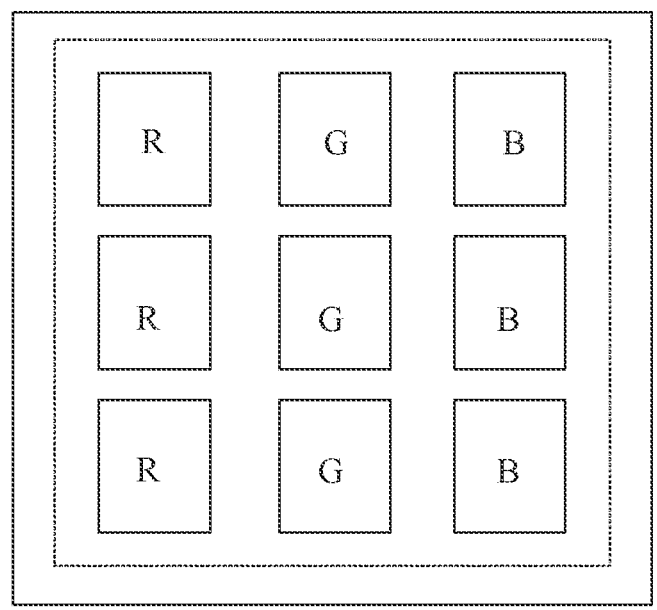
FIG. 22 is a diagram showing a distribution of sub-pixels in a display device, in accordance with some embodiments of the present disclosure.

In some examples, as shown in FIG. 22, the plurality of light-emitting devices 2 included in the display panel 100 are a plurality of sub-pixels. Each sub-pixel may emit light of a color, and the plurality of sub-pixels may emit light of multiple colors. For example, the plurality of sub-pixels may emit red light, green light, and blue light; or, the plurality of sub-pixels may emit magenta light, yellow light, and cyan light. On this basis, the sub-pixel may further emit white light.

In some embodiments, the display device 200 may be a product or component with a display function, such as a mobile phone, a tablet computer, a personal digital assistant (PDA), or a vehicle-mounted computer.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area and a frame area located at at least one side of the display area, the display panel comprising:
a base;
at least one groove arranged at a side of the base, and the at least one groove being located in the frame area;
a plurality of light-emitting devices disposed at the side of the base having the at least one groove, the plurality of light-emitting devices being located in the display area;
at least one first fixing component, each first fixing component including a first portion and a second portion, and the first portion of the first fixing component being embedded in a groove;

a sealant disposed at least in the frame area, the sealant being located at the side of the base having the at least one groove, and the second portion of the first fixing component being embedded in the sealant; and a pixel defining layer disposed at the side of the base having the at least one groove, the pixel defining layer having a plurality of openings; wherein at least a part of a light-emitting layer of each light-emitting device is located in an opening; and the first fixing component is made of a same material and disposed in a same layer as the pixel defining layer.

2. The display panel according to claim 1, wherein the second portion of the first fixing component has a fixing through hole, and the fixing through hole penetrates opposite side faces of the second portion of the first fixing component; and a part of the sealant fills the fixing through hole.

3. The display panel according to claim 1, wherein the second portion of the first fixing component has a wedge shape, and a tip of the wedge is away from the base substrate.

4. The display panel according to claim 3, wherein the second portion of the first fixing component has a shape of a right triangular prism;

the second portion of the first fixing component includes a first side face and a second side face disposed opposite to each other, and the fixing through hole penetrates the first side face and the second side face; and the second portion of the first fixing component further includes an inclined face located between the first side face and the second side face, an angle between the inclined face and a main surface of the base proximate to the sealant is an acute angle, and the inclined face is disposed to face the light-emitting devices.

5. The display panel according to claim 1, wherein the groove includes a first accommodating portion and a second accommodating portion; the first accommodating portion extends from a main surface of the base proximate to the sealant to an inside of the base, and the first portion of the first fixing component is embedded in the first accommodating portion; and the second accommodating portion is located inside the base, the second accommodating portion extends in a direction parallel to the main surface of the base proximate to the sealant, and one end of the second accommodating portion is connected to an end of the first accommodating portion extending to the inside of the base; and the first fixing component further includes an extension portion, and the extension portion is located in the second accommodating portion and connected to the first portion of the first fixing component.

6. The display panel according to claim 5, wherein the extension portion, the first portion of the first fixing component, and the second portion of the first fixing component are integrally formed.

7. The display panel according to claim 5, wherein an infiltration through hole is disposed between the main surface of the base proximate to the sealant and the second accommodating portion; and the infiltration through hole exposes the extension portion.

8. The display panel according to claim 7, wherein an orthographic projection of the infiltration through hole on the main surface of the base proximate to the sealant is within a range of an orthographic projection of the extension portion on the main surface of the base proximate to the sealant.

9. The display panel according to claim 7, wherein the first fixing component further includes an infiltration portion disposed in the infiltration through hole, and the infiltration portion is connected to the extension portion.

10. The display panel according to claim 7, wherein the infiltration through hole is located at a side of the first accommodating portion away from the display area.

11. The display panel according to claim 1, wherein the at least one first fixing component includes a plurality of first fixing components;

the plurality of first fixing components are located at at least one side of the display area; or the plurality of first fixing components are located at at least one corner of the display area.

12. The display panel according to claim 1, further comprising a second fixing component adjacent to the first fixing component, the second fixing component being disposed at a side of the first fixing component proximate to the display area; wherein the second fixing component and the first fixing component are mirror-symmetrical with respect to a plane that is located between the second fixing component and the first fixing component and perpendicular to the base; and a portion of the second fixing component that is mirror-symmetrical to the second portion of the first fixing component is embedded in the sealant.

13. The display panel according to claim 1, wherein an orthographic projection of the first fixing component on a main surface of the base proximate to the sealant has an arched shape, a circular shape, a rectangular shape or an elliptic shape.

14. A method for manufacturing a display panel, comprising:

providing a base, the base having a display area and a frame area located at at least one side of the display area;

forming at least one groove at a side of the base, the at least one groove being located in the frame area;

forming at least one first fixing component at the side of the base where the at least one groove has been formed, each first fixing component including a first portion and a second portion, and the first portion of the first fixing component being embedded in a groove;

forming a plurality of light-emitting devices at the side of the base where the at least one groove has been formed, the plurality of light-emitting devices being located in the display area; and forming a sealant, the sealant being located at the side of the base where the at least one groove has been formed, the sealant being located at least in the frame area, and the second portion of the first fixing component being embedded in the sealant;

wherein forming at least one groove at a side of the base, includes:

forming a photoresist pattern on a side of the base;

etching the base by using the photoresist pattern as a mask to form at least one first accommodating portion, each first accommodating portion including a bottom wall and a side wall connected to the bottom wall, and the side wall including a first region and a second region;

forming a corrosion-resistant film in the first region of the side wall and on the bottom wall, the corrosion-resistant film exposing the second region of the side wall, and the second region of the side wall being connected to the bottom wall, and the second region of the side wall and a main surface of the base proximate to the sealant having a distance therebetween; and etching the second region of the side wall by using a wet etching process to form a second accommodating portion, the second accommodating portion extending in a direction parallel to the main surface of the base proximate to the sealant, and one end of the second accommodating portion being connected to the first accommodating portion.

15. The method for manufacturing a display panel according to claim 14, wherein forming a plurality of light-emitting devices, includes: forming light-emitting layers of the plurality of light-emitting devices;

before the light-emitting layers of the plurality of light-emitting devices are formed, the method comprises:

forming a pixel defining film at the side of the base where the at least one groove has been formed; and patterning the pixel defining film to form a plurality of openings located in the display area and the at least one first fixing component located in the frame area, wherein each first fixing component includes the first portion embedded in the first accommodating portion, an extension portion located in the second accommodating portion, and the second portion protruding with respect to the main surface of the base.

16. A display device, comprising the display panel according to claim 1.

17. A display panel having a display area and a frame area located at at least one side of the display area, the display panel comprising:

a base;

at least one groove arranged at a side of the base, and the at least one groove being located in the frame area;

a plurality of light-emitting devices disposed at the side of the base having the at least one groove, the plurality of light-emitting devices being located in the display area;

at least one first fixing component, each first fixing component including a first portion and a second portion, and the first portion of the first fixing component being embedded in a groove; and a sealant disposed at least in the frame area, the sealant being located at the side of the base having the at least one groove, and the second portion of the first fixing component being embedded in the sealant;

wherein the groove includes a first accommodating portion and a second accommodating portion;

the first accommodating portion extends from a main surface of the base proximate to the sealant to an inside of the base, and the first portion of the first fixing component is embedded in the first accommodating portion; and the second accommodating portion is located inside the base, the second accommodating portion extends in a direction parallel to the main surface of the base proximate to the sealant, and one end of the second accommodating portion is connected to an end of the first accommodating portion extending to the inside of the base; and the first fixing component further includes an extension portion, and the extension portion is located in the second accommodating portion and connected to the first portion of the first fixing component.

18. The display panel according to claim 17, wherein the extension portion, the first portion of the first fixing component, and the second portion of the first fixing component are integrally formed.

19. The display panel according to claim 17, wherein an infiltration through hole is disposed between the main surface of the base proximate to the sealant and the second accommodating portion; and the infiltration through hole exposes the extension portion.

20. A display device, comprising the display panel according to claim 17.

* * * * *